United States Patent
Ando et al.

(10) Patent No.: US 7,378,154 B2
(45) Date of Patent: May 27, 2008

(54) PHOTOFUNCTIONAL LAMINATED ARTICLE

(75) Inventors: Yoshito Ando, Settsu (JP); Takayuki Araki, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 30 days.

(21) Appl. No.: 11/578,054

(22) PCT Filed: Mar. 11, 2005

(86) PCT No.: PCT/JP2005/004330

§ 371 (c)(1),
(2), (4) Date: Oct. 12, 2006

(87) PCT Pub. No.: WO2005/100011

PCT Pub. Date: Oct. 27, 2005

(65) Prior Publication Data

US 2007/0218289 A1    Sep. 20, 2007

(30) Foreign Application Priority Data

| Apr. 15, 2004 | (JP) | 2004-120818 |
| Jun. 18, 2004 | (JP) | 2004-180916 |
| Jan. 28, 2005 | (JP) | 2005-021193 |

(51) Int. Cl.
*B32B 7/02* (2006.01)
*B32B 17/06* (2006.01)
*B32B 9/00* (2006.01)
*B32B 27/30* (2006.01)

(52) U.S. Cl. ...................................... 428/421
(58) Field of Classification Search ................. 428/421
See application file for complete search history.

(56) References Cited

FOREIGN PATENT DOCUMENTS

| JP | 10-190066 A | 7/1998 |
| JP | 2003-017755 A | 1/2003 |
| JP | 2003-124530 A | 4/2003 |

*Primary Examiner*—Evan Pert
(74) *Attorney, Agent, or Firm*—Sughrue Mion, PLLC

(57) ABSTRACT

There is provided a photofunctional laminated article being excellent in various photofunctionalities, particularly an intensity of light emission, light emitting efficiency and further fluorescence life and light amplifying property. The photofunctional laminated article comprises the transparent substrate (L0), the photofunctional layer (L1) comprising the fluorine-containing polymer (A) and the rare earth metal compound (B) and being formed on the substrate (L0) and the low refractive index layer (L2) formed on the photofunctional layer (L1), and when refractive indices of each layer are assumed to be n(L0), n(L1) and n(L2), the following equation: $n(L0) \geq n(L1) > n(L2)$ is satisfied.

9 Claims, No Drawings

PHOTOFUNCTIONAL LAMINATED ARTICLE

TECHNICAL FIELD

The present invention relates to a photofunctional laminated article produced by providing, on a transparent substrate, a photofunctional layer containing a rare earth metal compound which can exhibit photofunctionalities such as a fluorescence (light emission) phenomenon and a light amplifying phenomenon.

Specifically the present invention relates to a laminated article which comprises a low refractive index layer and a photofunctional layer containing a rare earth metal compound and a fluorine-containing polymer and being capable of exhibiting photofunctionalities at higher efficiency.

BACKGROUND ART

LED is a crystal having p-n junction. When a forward voltage is applied thereto, electron moves from N-region to the p-n junction and electron hole moves from P-region to the p-n junction and light is emitted at the time of recombination of the electron and the electron hole. Therefore since free electrons are in a combined state and at that time, the resulting energy is released in the form of light, LED emits only a light of limited color tones.

Namely, LED having a red LED chip emits only red light, LED having a green LED chip emits only green light, and LED having a blue LED chip emits only blue light.

However a light emitting diode being capable of changing color of emitted light for various applications is strongly demanded.

Usually for changing color of light emission, for example, combination of a red LED chip, green LED chip and blue LED chip are set in a light emitting diode, and a color change is achieved by changing the combination of the respective chips and emitting a light.

In such a light emitting diode, different four terminals are required for the above-mentioned three color LED chips, and therefore there is a problem that a structure design thereof is complicated and further when any one of three color LED chips is broken, a balance of color tone is lost and intended light emission cannot be obtained.

Also there is proposed a white LED lamp produced by providing a layer of fluorescent substance of YAG (yttrium aluminum garnet) on a blue light emitting diode chip.

In this white LED lamp, white light is produced from light excited by the fluorescent substance layer and afterglow of the blue light emitting diode.

However in the above-mentioned white LED lamp, an amount of fluorescent substance on the blue light emitting diode chip is very small and a color tone tends to be changed greatly by an error in the amount of fluorescent substance and by a processing method. Therefore it is difficult to produce a uniform LED and differences in color and brightness arise inevitably, resulting in a low yield and a high cost.

In order to solve those problems, JP11-87784 proposes that a covering material containing a fluorescent substance and a resin acting as a binder thereof is attached to a light emitting diode for adjusting to an intended color tone. Namely, kind and amount of the fluorescent substance to be contained in the covering material are adjusted, and further a coloring agent is contained as case demands and the covering material is formed into a sheet, cap or the like and provided on the light emitting diode, thus producing a desired color tone freely with high reproducibility.

According to the investigation by the present inventors, the covering material disclosed in JP11-87784 is insufficient in a light emitting intensity and light emitting efficiency, and in order to achieve an intended color tone and color emission, it is necessary to increase a content of the fluorescent substance in the covering material and set a thickness of the covering material high.

However even by a trial of increasing a content of the fluorescent substance in the covering material for increasing a light emitting intensity, there is a limit in an amount of fluorescent substance which can be mixed, and if the ratio of the fluorescent substance is increased excessively, dispersion failure and white turbidity arise, and as a result, light transmission is lowered and intended color and light emission cannot be obtained.

The present inventors have made intensive studies with respect to a laminated article which has a photofunctional layer containing a rare earth metal compound being capable of exhibiting a fluorescence (light emission) phenomenon and light amplifying phenomenon, and as a result, have found that a light emitting intensity, light emitting efficiency and further a fluorescence life are enhanced more firstly by using a specific polymer as a matrix polymer (binder resin) of a photofunctional layer and secondly by providing a low refractive index layer on the photofunctional layer and selecting a specific refractive index for the transparent substrate, photofunctional layer and low refractive index layer, and have completed the present invention.

DISCLOSURE OF INVENTION

An object of the present invention is to provide a photofunctional laminated article being excellent in various photofunctionalities, particularly an intensity of light emission, light emitting efficiency and further fluorescence life and light amplifying property.

Namely, the present invention relates to a photofunctional laminated article which comprises:

(L0) a transparent substrate, (L1) a photofunctional layer comprising a fluorine-containing polymer (A) and a rare earth metal compound (B) and being formed on the substrate (L0) and (L2) a low refractive index layer formed on the layer (L1), and is characterized in that when refractive indices of each layer are assumed to be n(L0), n(L1) and n(L2), the following equation:

$$n(L0) \geq n(L1) > n(L2)$$

is satisfied.

It is preferable that the fluorine-containing polymer (A) in the photofunctional layer (L1) is a non-crystalline polymer having a fluorine content of not less than 30% by mass, a fluorine-containing acrylic polymer having a glass transition temperature of not less than 40° C. and a fluorine content of not less than 50% by mass, or a fluorine-containing acrylic polymer having a glass transition temperature of not less than 100° C. and a fluorine content of not less than 30% by mass and less than 50% by mass.

Also it is preferable that the fluorine-containing polymer (A) in the photofunctional layer (L1) is a fluorine-containing acrylic polymer comprising:

a structural unit derived from at least one selected from fluorine-containing acrylates (a1-1) represented by the formula (1):

wherein $X^1$ is H, F, Cl, $CH_3$ or $CF_3$; $R^1$ is selected from monovalent hydrocarbon groups which have 1 to 50 carbon atoms and may have ether bond and monovalent fluorine-containing hydrocarbon groups which have 1 to 50 carbon atoms and may have ether bond, provided that at least either $X^1$ or $R^1$ contains fluorine atom, and a structural unit derived from at least one selected from polyfunctional acrylates (a1-2) represented by the formula (4):

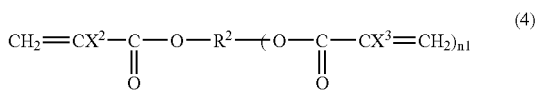

wherein $X^2$ and $X^3$ are the same or different and each is H, F, Cl, $CH_3$ or $CF_3$; n1 is an integer of 1 to 6; $R^2$ is a (n1+1)-valent organic group having 1 to 50 carbon atoms.

Examples of the material for the transparent substrate (L0) are glass materials and transparent resins. Preferred example of the transparent resin is at least one kind selected from acrylic resins, polycarbonate resins, transparent polyetheylene terephthalates, methyl cellulose resins and cycloolefin resins.

It is preferable that the transparent substrate (L0) is in the form of film.

BEST MODE FOR CARRYING OUT THE INVENTION

The present invention relates to the photofunctional laminated article which comprises:
(L0) the transparent substrate,
(L1) the photofunctional layer comprising the fluorine-containing polymer (A) and the rare earth metal compound (B) and being formed on the substrate (L0) and
(L2) the low refractive index layer formed on the layer (L1), and is characterized in that when refractive indices of each layer are assumed to be n(L0), n(L1) and n(L2), the following equation:

$n(L0) \geq n(L1) > n(L2)$ is satisfied.

Namely, the photofunctional laminated article of the present invention is characterized in that the article has, as the photofunctional layer (L1), a layer containing the fluorine-containing polymer (A) and the rare earth metal compound (B) being capable of exhibiting photofunctionalities such as fluorescence (light emission) and light amplification by feeding thereto light (excitation light) from light source, and further the low refractive index layer (L2) is provided on the photofunctional layer (L1).

The rare earth metal compound in the photofunctional layer (L1) can exhibit photofunctionalities such as fluorescence (light emission) and light amplification by an incident light (excitation light) from light source such as a light emitting diode, and when a polymer having fluorine atom, particularly a highly fluorinated non-crystalline polymer is used as a matrix polymer (binder resin) of the photofunctional layer (L1), light (excitation light) from light source can be converted to fluorescence (light emission) more efficiently, and as a result, an intensity of light emission, quantum yield of light emission and life of light emission can be improved.

Further it is important to provide the low refractive index layer (L2) on the photofunctional layer (L1), and when the low refractive index layer (L2) is set at the side of the incident light from a light emission diode or the like, a reflection phenomenon of the incident light (excitation light) can be inhibited at an interface between the air layer and the laminated article and the incident light (excitation light) is fed more efficiently to the rare earth metal compound of the photofunctional layer (L1).

To provide the low refractive index layer (L2) is also preferred because light emission (fluorescence) of the rare earth metal compound of the photofunctional layer (L1) by feeding incident light can be directed preferentially to an intended direction, for example, to the direction opposite to the incident light (to the direction of the transparent substrate (L0)).

Next, the construction of each layer in the photofunctional laminated article of the present invention is explained below.

In the photofunctional layer (L1) of the laminated article of the present invention, the rare earth metal compound (B) is compatibly dissolved or dispersed in the fluorine-containing polymer (A), and the fluorine-containing polymer (A) makes it possible to carry out light emission at high intensity and high efficiency.

A light emission phenomenon of a rare earth metal compound is usually a phenomenon such that an energy level of a rare earth metal ion is increased by absorption of excitation light such as ultraviolet light to be acted thereon and then when the energy level is decreased to a ground state, light corresponding to the resultant energy difference is generated as light of specific wavelength (visual light or near infrared light).

A wavelength of necessary excitation light and a wavelength of emitted light vary depending on kind of a rare earth metal ion and are derived from properties inherent to a rare earth metal ion.

In the above-mentioned light emission phenomenon, generally the whole of the applied excitation light is not always converted to light emission energy, and it can be considered that a part of the excitation light is changed to a vibration energy (namely, thermal energy) of molecules or atoms neighboring to the rare earth metal ion and therefore the intensity and quantum yield (light emission efficiency) of the rare earth metal ion become insufficient.

An energy transfer from a rare earth metal ion to a matrix polymer could be inhibited by using a fluorine-containing polymer, particularly a non-crystalline fluorine-containing polymer having a high fluorine content as a matrix polymer of the rare earth metal compound (B), and as a result, a light emission intensity and quantum yield of the rare earth metal compound could be increased.

The fluorine-containing polymer (A) to be used for the photofunctional layer (L1) of the present invention is optionally selected depending on purpose and wavelength of light emission (fluorescence), and it is preferable that the polymer itself is a colorless non-crystalline fluorine-containing polymer which is high in transparency in a wide range of wavelength.

It is desirable that the fluorine content of the fluorine-containing polymer (A) is as high as possible. The fluorine content is not less than 20% by mass, preferably not less than 30% by mass, more preferably not less than 40% by mass, particularly preferably not less than 50% by mass.

A too high fluorine content is not preferred because compatibility with and dispersibility of the rare earth metal compound (B) are lowered though it depends on the structure of the polymer.

Also though it is desirable that the fluorine-containing polymer (A) is transparent in a wide range of wavelength of light, it is important that the polymer is transparent at a wavelength of light to be used actually, for example, an incident light (excitation light) and an emitting light (fluorescent light).

Specifically, at wavelengths of an incident light (excitation light) and an emitting light (fluorescent light), an absorption coefficient of the fluorine-containing polymer (A) is not more than $5.0 \times 10^{-5}$ $\mu m^{-1}$, preferably not more than $1.0 \times 10^{-5}$ $\mu m^{-1}$, more preferably not more than $5.0 \times 10^{-6}$ $\mu m^{-1}$, particularly preferably not more than $2.0 \times 10^{-6}$ $\mu m^{-1}$.

Insufficient transparency of the fluorine-containing polymer (A) is not preferred because an intensity of light emission is lowered.

The fluorine-containing polymer (A) is a non-crystalline polymer having the above-mentioned characteristics. The first of the preferred fluorine-containing polymer is a fluorine-containing acrylate polymer (A1).

The fluorine-containing acrylate polymer (A1) has a structural unit derived from a fluorine-containing acrylate having fluorine atom at least either at a portion being capable of forming a polymer side chain or at a portion being capable of forming a polymer trunk chain. It is preferable that the fluorine-containing acrylate polymer (A1) has a structural unit derived from at least one monomer selected from fluorine-containing acrylates (a1-1) represented by the formula (1):

wherein $X^1$ is H, F, Cl, $CH_3$ or $CF_3$; $R^1$ is selected from monovalent hydrocarbon groups which have 1 to 50 carbon atoms and may have ether bond and monovalent fluorine-containing hydrocarbon groups which have 1 to 50 carbon atoms and may have ether bond, provided that at least either $X^1$ or $R^1$ contains fluorine atom. Concretely there are monomers having a structure excluding $R^1$ which is represented by:

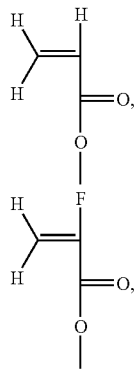

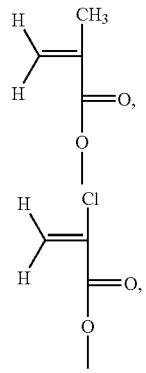

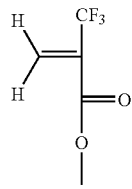

or the like, and from the viewpoint of polymerizability, preferred are those having a structure of:

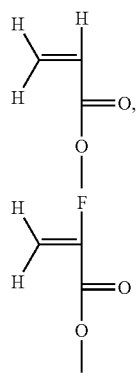

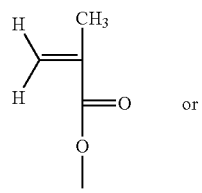

and further preferred is one having a structure of:

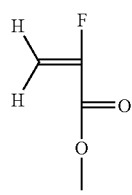

because an intensity of light emission and a light emitting efficiency can be enhanced in the case of the composition containing the polymer and the rare earth metal compound (B) and also because transparency, heat resistance and further a mechanical strength can be imparted to the obtained polymer.

When $X^1$ in the fluorine-containing acrylate (a1-1) is F or $CF_3$, $R^1$ in the side chain may not contain fluorine atom, and it is usually preferable that $R^1$ is at least one selected from monovalent fluorine-containing alkyl groups which have 1 to 50 carbon atoms and may have ether bond and monovalent fluorine-containing aryl groups which have 2 to 50 carbon atoms and an aromatic ring structure and may have ether bond.

Such $R^1$ is preferred because the fluorine content of the fluorine-containing acrylate polymer (A1) can be increased remarkably, and in the case of the composition containing the polymer and the rare earth metal compound (B), an intensity of light emission and a light emitting efficiency can be enhanced.

It is particularly preferable that $R^1$ is at least one selected from monovalent fluorine-containing alkyl groups which have 1 to 50 carbon atoms and may have ether bond, from the viewpoint of transparency and further from the viewpoint of an intensity of light emission and a light emitting efficiency.

In the fluorine-containing acrylate of the formula (a1-1), preferred examples of the side chain $R^1$ are as follows.

(i) Fluorine-containing Linear Alkyl Group

Concretely there are groups represented by the formula (R1-1):

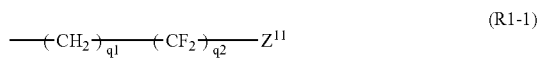
(R1-1)

wherein $Z^{11}$ is at least one selected from H, F, Cl and Br; q1 is 0 or an integer of 1 to 5; q2 is an integer of 1 to 20.

In the formula (R1-1), q1 is preferably an integer of 1 to 4, particularly 1 or 2, and q2 is preferably from 1 to 10, more preferably from 1 to 6, particularly preferably from 1 to 4.

If q1 is too large, there is a tendency that an effect of improving an intensity of light emission and a light emitting efficiency of the composition containing the polymer and the rare earth metal compound (B) is reduced. Also if q2 is too large, there is a tendency that transparency of the fluorine-containing acrylate polymer (A1) is decreased and dispersibility of the rare earth metal compound (B) is lowered, resulting in lowering of transparency of the composition containing the polymer and the rare earth metal compound (B).

Examples thereof are:
—$CH_2CF_3$, —$CH_2CF_2CF_3$, —$CH_2CF_2CF_2H$, —$CH_2(CF_2CF_2)_2H$, —$CH_2CH_2(CF_2CF_2)_2F$, —$CH_2CH_2(CF_2CF_2)_3F$, —$CH_2(CF_2CF_2)_2Cl$, —$CH_2CF_2CF_2Cl$ and the like.

Further in the formula (R1-1), it is preferable that $Z^{11}$ at an end of the side chain is H or Cl, and particularly preferred is hydrogen atom, thereby enabling dispersibility and solubility (compatibility) of the rare earth metal compound (B) to be improved as compared with the case where $Z^{11}$ is fluorine atom.

From those points of view, preferred are:
—$CH_2CF_2CF_2H$, —$CH_2(CF_2CF_2)_2H$, —$CH_2(CF_2CF_2)_3H$, —$CH_2(CF_2CF_2)_4H$, —$CH_2(CF_2CF_2)_2Cl$ and —$CH_2CF_2CF_2Cl$ and
—$CH_2CF_2CF_2H$ and —$CH_2(CF_2CF_2)_2H$, are particularly preferred.

(ii) Fluorine-containing Branched Alkyl Group

Concretely there are fluorine-containing alkyl groups having a branched structure and represented by the formula (R1-2):

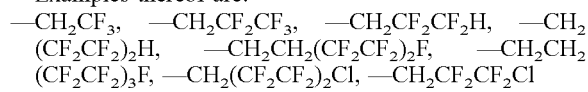
(R1-2)

wherein $R^{10}$ is a linear alkylene group having 1 to 10 carbon atoms in which a part or the whole of hydrogen atoms may be replaced by fluorine atoms; $R^{11}$ is a fluorine-containing linear alkyl group which has 1 to 10 carbon atoms and may have ether bond; $R^{12}$ is at least one selected from linear alkyl groups having 1 to 5 carbon atoms or fluorine-containing linear alkyl groups which have 1 to 5 carbon atoms and may have ether bond; $R^{13}$ is at least one selected from H, F, linear alkyl groups having 1 to 5 carbon atoms and fluorine-containing linear alkyl groups which have 1 to 10 carbon atoms and may have ether bond; q3 is 0 or 1. Concretely preferred are fluorine-containing alkyl groups represented by the formula (R1-2-1):

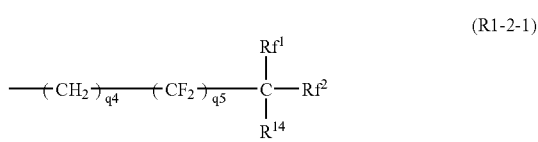
(R1-2-1)

wherein $Rf^1$ and $Rf^2$ are the same or different and each is a perfluoroalkyl group having 1 to 5 carbon atoms; $R^{14}$ is H, F or a hydrocarbon group having 1 to 5 carbon atoms in which a part or the whole of hydrogen atoms may be replaced by fluorine atoms; q4+q5 is an integer of 1 to 10, and more concretely there are preferably:

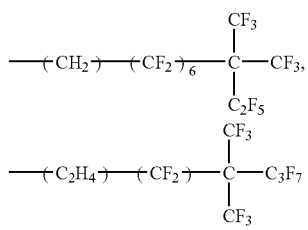

and the like.

Those groups are preferred because more enhanced transparency can be imparted to the fluorine-containing acrylate polymer (A1) of the present invention.

Also among the groups of the formula (R1-2-1), preferred as $R^1$ are fluorine-containing alkyl groups represented by the formula (R1-2-2):

(R1-2-2)

wherein $Rf^1$, $Rf^2$ and $R^{14}$ are as defined in the formula (R1-2-1), and more concretely there are preferably:

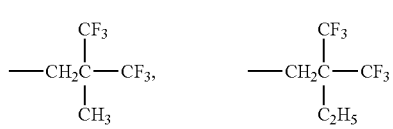

and the like.

Those groups are preferred because a glass transition temperature can be set higher and dispersibility of the rare earth metal compound is excellent.

Further preferred as $R^1$ are fluorine-containing alkyl groups represented by the formula (R1-2-3):

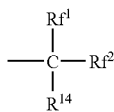
(R1-2-3)

wherein $Rf^1$, $Rf^2$ and $R^{14}$ are as defined in the formula (R1-2-1), and more concretely there are preferably:

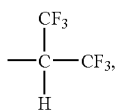 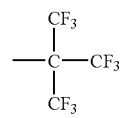

and the like.

In those examples of the fluorine-containing branched alkyl groups (ii), particularly preferred are the fluorine-containing alkyl groups represented by:

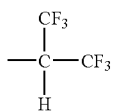 and 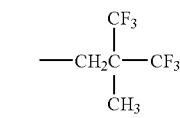

because a polymer providing excellent dispersibility of a variety of rare earth metal compounds and having enhanced glass transition temperature and excellent heat resistance can be obtained.

By those effects, an intensity of light emission (amplification) and a light emitting (amplifying) efficiency of the composition containing the polymer and the rare earth metal compound (B) can be enhanced.

(iii) Fluorine-containing Alkyl Group having Ether Bond

There are fluorine-containing alkyl groups having a moiety of fluorine-containing alkylene ether structure, concretely fluorine-containing alkyl groups having a structure represented by the formula (1-1):

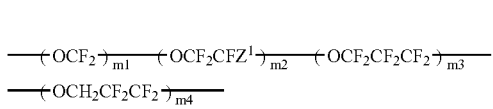
(1-1)

wherein $Z^1$ is F or $CF_3$; m1, m2, m3 and m4 are 0 or integers of 1 to 10 and m1+m2+m3+m4 is an integer of 1 to 10.

The polymer (A) of the present invention prepared by using the fluorine-containing acrylate monomer having the mentioned moiety has a high fluorine content and high transparency, and an intensity of light emission (amplification) and a light emitting (amplifying) efficiency of the composition containing the polymer and the rare earth metal compound (B) can be enhanced.

Examples of the side chain portion $R^1$ having the moiety of the formula (1-1) are: (1-2):

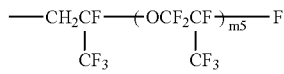

wherein m5 is an integer of 1 to 5, (1-3):

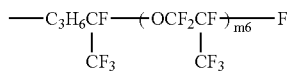

wherein m6 is an integer of 1 to 6, (1-4):

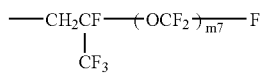

wherein m7 is an integer of 1 to 8, (1-5):

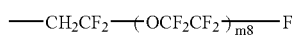

wherein m8 is an integer of 1 to 8, (1-6):

wherein m9 is an integer of 1 to 7, (1-7):

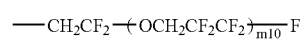

wherein m10 is an integer of 1 to 8 and the like.

Among them, more preferred is the side chain structure of the formula (1-2):

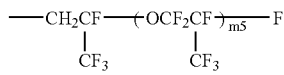
(1-2)

wherein m5 is an integer of 1 to 5, because a fluorine content is high and an intensity of light emission (amplification) and a light emitting (amplifying) efficiency of the composition containing the polymer and the rare earth metal compound (B) can be enhanced more effectively.

In the photofunctional laminated article of the present invention, preferred examples of the fluorine-containing acrylate (a1-1) providing the structural unit A1-1 constituting the fluorine-containing acrylate polymer (A1) are monomers raised below. (a1-i) Monomers having a Fluorine-containing Linear Alkyl Group Preferred examples thereof are:

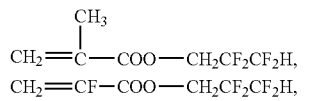
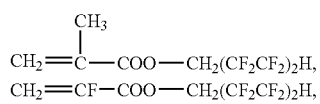
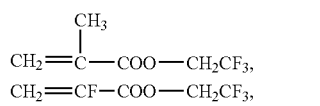
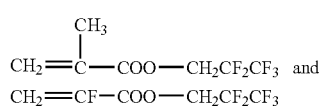

and among them,
CH$_2$=CF—COO—CH$_2$CF$_2$CF$_2$H and CH$_2$=CF—COO—CH$_2$(CF$_2$CF$_2$)$_2$H are particularly preferred.

(a1-ii) Monomers having a Fluorine-containing Branched Alkyl Group
 Preferred examples thereof are:

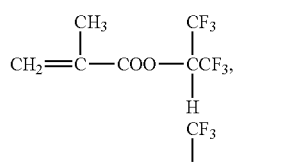
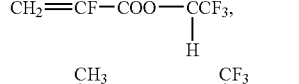
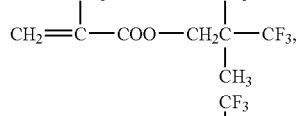
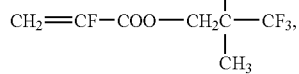
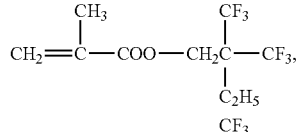
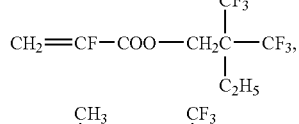
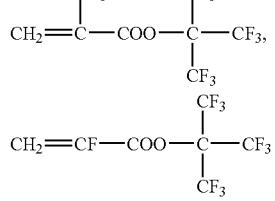

and the like, and

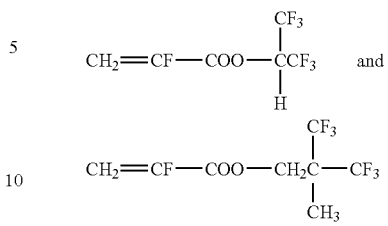

are particularly preferred.

(a1-iii) Monomers having, in the Side Chain thereof, a Fluorine-containing Alkyl Group having Ether Bond
 Preferred examples thereof are:

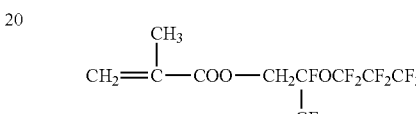
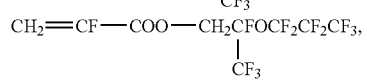
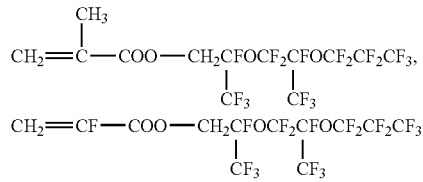

and the like, and

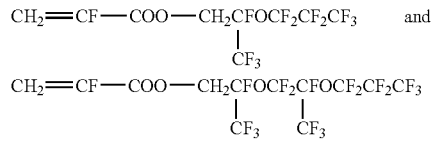

are particularly preferred.

Also the weight average molecular weight of the fluorine-containing acrylate polymer (A1) is preferably from 500 to 1,000,000, further preferably from 5,000 to 800,000, particularly preferably from 10,000 to 500,000.

The first of the preferred fluorine-containing acrylate polymer (A1) of the present invention is a fluorine-containing acrylic polymer (A1-I) having a glass transition temperature of not less than 40° C. and a fluorine content of not less than 50% by mass.

If the glass transition temperature is less than 40° C., there is a problem with stability of shape because deformation arises at room temperature, and also there is a case where migration and re-distribution of the rare earth metal ion arise, resulting in occurrence of phase separation. The glass transition temperature is preferably not less than 65° C., further not less than 100° C. from the viewpoint of heat resistance because the matrix polymer itself is heated due to self heat generation when used for a light emitting device and the like. An upper limit of the glass transition temperature is not limited particularly, and is usually about 200° C. in the case of fluorine-containing acrylic polymers.

It is a matter of course that the fluorine content is as high as possible. The fluorine content is not less than 52% by mass, especially not less than 55% by mass. An upper limit of the fluorine content is also not limited particularly, and is usually about 76% by mass not to lower compatibility with the rare earth metal ion and also from the viewpoint of limitation in a chemical structure.

Preferred as the fluorine-containing acrylate polymer (A1-I) are fluorine-containing acrylic polymers having a structure of the formula (2):

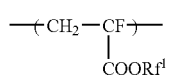
(2)

wherein $Rf^1$ is a fluorine-containing hydrocarbon group which has 1 to 40 carbon atoms and may have ether bond because even in the case of a homopolymer and further a copolymer, it is easy to obtain a polymer having a glass transition temperature of not less than 40° C. and a fluorine content of not less than 50% by mass and also an intensity of light emission is high enough. Preferred as $Rf^1$ are fluorine-containing alkyl groups which have 1 to 40 carbon atoms and may have ether bond or fluorine-containing aryl groups which have 3 to 40 carbon atoms and may have ether bond.

Preferred examples of the acrylate (hereinafter referred to as "αFacrylate") which has fluorine atom at α-position and can form the fluorine-containing acrylic polymer having the structure of the formula (2) are, for instance, those raised below. The parenthesized descriptions following the chemical formula of each monomer represent (abbreviation) and (glass transition temperature and fluorine content (% by mass) of homopolymer) (hereinafter the same).

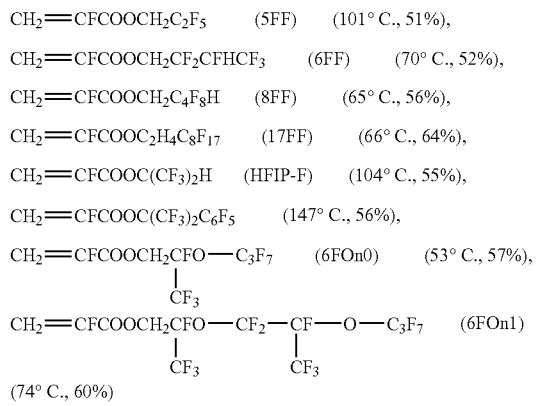

Among them, HFIP-F and 8FF are preferred from the viewpoint of high affinity for the complex. Also αFacrylate having a branched structure in its side chain is preferred since the glass transition temperature can be made high.

Also preferred as the fluorine-containing acrylate polymer (A1-I) are fluorine-containing methacrylate polymers having a structure of the formula (3):

(3)

wherein $Rf^3$ is a fluorine-containing hydrocarbon group which has 1 to 40 carbon atoms and not less than 7 fluorine atoms and may have ether bond because even in the case of a homopolymer, a glass transition temperature of not less than 40° C. and a fluorine content of not less than 50% by mass are exhibited and an intensity of light emission is high enough. Preferred as $Rf^3$ are fluorine-containing alkyl groups which have 1 to 40 carbon atoms and may have ether bond or fluorine-containing aryl groups which have 3 to 40 carbon atoms and may have ether bond.

Preferred examples of the monomer giving the structure of the formula (3) are, for instance, those raised below.
$CH_2=C(CH_3)COOCH_2C_4F_8H$ (8FM) (47° C., 51%),
$CH_2=C(CH_3)COOC_2H_4C_8F_{17}$ (17FM) (40° C., 61%),
$CH_2=C(CH_3)COOC(CF_3)_3$ (9FtBuM) (156° C., 56%),
$CH_2=C(CH_3)COOC(CF_3)_2C_6F_5$ (132° C., 52%)

Among them, 8FM is preferred from the viewpoint of good affinity for the complex. Also fluorine-containing methacrylates having a branched structure in the side chain thereof are preferred since the glass transition temperature becomes high.

Further the fluorine-containing acrylate polymer (A1-I) may be a copolymer of the above-mentioned αFacrylate and the above-mentioned fluorine-containing methacrylate, and the composition and copolymerization ratio thereof are selected so that the copolymer has the glass transition temperature of not less than 40° C. and the fluorine content of not less than 50% by mass.

In this case, with respect to the combination of the copolymerizing monomers, preferred are a copolymer of HFIP-F and 8FM, a copolymer of 6FOnO and 8FM, a copolymer of 17FF and 8FM and the like because an intensity of light emission and a mechanical strength are excellent.

To the fluorine-containing acrylate polymer (A1-I) may be introduced other copolymerizable monomer in addition to the above-exemplified αFacrylate and/or the fluorine-containing methacrylate.

When introducing other monomer, the composition and copolymerization ratio are selected so that the obtained copolymer has the glass transition temperature of not less than 40° C. and the fluorine content of not less than 50% by mass.

Examples of the other monomer are, for instance, those raised below.
$CH_2=C(CH_3)COOCH_3$ (MMA) (120° C., 0%),
$CH_2=C(CH_3)COOCH_2C(CF_3)_2H$ (6FiP-M) (72° C., 48%),
$CH_2=C(CH_3)COOCH_2C(CF_3)_2CH_3$ (6FNPM) (120° C., 43%),
$CH_2=CFCOOCH_2CF_3$ (3FF) (125° C., 44%),
$CH_2=CFCOOCH_2C(CF_3)_2CH_3$ (6FNPF) (135° C., 49%),
$CH_2=CFCOOC(CH_3)_2H$ (IP-F) (93° C., 14%),
$CH_2=CFCOOC_6F_5$ (PFPh-F) (160° C., 45%)

Preferred as the other monomer is MMA because a mechanical strength is enhanced or improved. Also 6FNPM, 6FNPF and PFPh-F are preferred because the glass transition temperature can be increased while hardly lowering the fluorine content.

Also with respect to the combination of the copolymerizing monomers, preferred are a copolymer of HFIP-F and MMA, a terpolymer of HFIP-F, MMA and 6FNPF, a copolymer of 5FF and 6FNPF and the like because a balance of an intensity of light emission and a mechanical strength is good.

The second of the preferred fluorine-containing acrylate polymer (A1) of the present invention is a fluorine-containing acrylic polymer (A1-II) having a glass transition temperature of not less than 100° C. and a fluorine content of not less than 30% by mass and less than 50% by mass.

When the glass transition temperature is higher than 100° C., sufficient intensity of light emission can be obtained even at a relatively low fluorine content. It is a matter of course that a higher fluorine content is preferred. The fluorine content is not less than 35% by mass, especially not less than 40% by mass.

An upper limit of the glass transition temperature is not limited particularly, and is usually about 200° C. in the case of fluorine-containing acrylic polymers.

Examples of the fluorine-containing acrylic polymer (A1-II) are as follows.

(A1-IIa) Homopolymer of Fluorine-containing Acrylic Monomer:

Among the monomers providing the structure represented by the formula (1), examples of the monomer providing a homopolymer having a glass transition temperature of not less than 100° C. and a fluorine content of not less than 30% by mass and less than 50% by mass are, for instance, (3FF) (125° C., 44%), (6FNPF) (135° C., 49%), (PFPh-F) (160° C., 45%), (6FNPM) (120° C., 43%) and the like which are exemplified in (A1-I).

Among them, 6FNPF and 6FNPM are preferred because of high affinity for the rare earth metal compound, particularly the rare earth metal complex. Also preferred as the obtained fluorine-containing acrylic polymer are those having a branched structure in the side chain thereof because the glass transition temperature becomes high.

(A1-IIb) Copolymer of the Fluorine-containing Acrylic Monomers Represented by (A1-IIa) or Copolymer of the Fluorine-containing Acrylic Monomer Represented by (A1-IIa) and an Other Fluorine-containing Acrylic Monomer:

The composition and copolymerization ratio are selected so that the copolymer has the glass transition temperature of not less than 100° C. and the fluorine content of not less than 30% by mass and less than 50% by mass.

Examples of the other fluorine-containing acrylic monomer are, for instance, 6FiP-M, IP-F and the like.

With respect to the combination of the copolymerizing monomers, preferred are a copolymer of 3FF and 6FNPM, a copolymer of PFPh-F and 6FNPM, a copolymer of 6FNPF and 6FNPM and the like because an intensity of light emission and a mechanical strength are good. Also the use of 6FiP-M and IP-F as the other fluorine-containing acrylic monomer is preferred because a mechanical strength can be imparted without decreasing the glass transition temperature.

(A1-IIc) Copolymer of the Fluorine-containing Acrylic Monomer Represented by (A1-IIa) and a Non-fluorine-containing Acrylic Monomer:

The composition and copolymerization ratio of the fluorine-containing acrylic monomer and the non-fluorine-containing acrylic monomer are selected so that the obtained copolymer has the glass transition temperature of not less than 100° C. and the fluorine content of not less than 30% by mass and less than 50% by mass.

Particularly preferred as the non-fluorine-containing acrylic monomer is, for instance, (MMA) (120° C., 0%) because a mechanical strength can be improved.

Preferred examples of the copolymer are, for instance, a copolymer of 6FNPM and MMA, a copolymer of 6FNPF and MMA, a terpolymer of 6FNPM, MMA and IP-F, a terpolymer of 6FNPF, MMA and IP-F and further a copolymer of MMA and 5FF because a balance of an intensity of light emission and a mechanical strength is good.

The third of the preferred fluorine-containing acrylic polymer (A1) of the present invention is a polymer (A1-III) which is characterized by containing a structural unit derived from the fluorine-containing acrylate (a1-1) and a structural unit derived from the polyfunctional acrylate (a1-2).

The introduction of the structural unit derived from the polyfunctional acrylate (a1-2) can greatly enhance an intensity of light emission (amplification) and a light emitting (amplifying) efficiency of the photofunctional material obtained from the composition containing the polymer and the rare earth metal compound.

The polyfunctional acrylate (a1-2) is at least one selected from the acrylates of the formula (4):

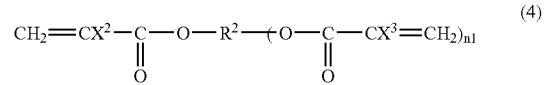

wherein $X^2$ and $X^3$ are the same or different and each is H, F, Cl, $CH_3$ or $CF_3$; n1 is an integer of 1 to 6; $R^2$ is a (n1+1)-valent organic group having 1 to 50 carbon atoms.

In the polyfunctional acrylate of the formula (4), each of $X^2$ and $X^3$ is H, $CH_3$, F, $CF_3$ or Cl, and particularly $CH_3$ and F are preferred and further F is preferred.

$R^2$ is a (n1+1)-valent organic group having 1 to 50 carbon atoms, and concretely there are:

(1) linear or branched (n1+1)-valent organic group which may have ether bond,
(2) (n1+1)-valent organic group having aromatic ring structure,
(3) (n1+1)-valent organic group having aliphatic ring (monocyclic or polycyclic) structure,
(4) (n1+1)-valent organic group having urethane bond and the like. In those organic groups, a part or the whole of hydrogen atoms forming a carbon-hydrogen bond may be replaced by fluorine atoms.

First, preferred embodiments of the respective $R^2$ are explained by means of examples thereof.

(1) Linear or Branched (n1+1)-valent Organic Group which may have Ether Bond:

In the case of n1=1 (bifunctional acrylate) in the formula (4) representing the polyfunctional acrylate (a1-2), there are, for example, organic groups represented by the formula (R2-1):

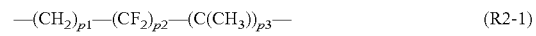

wherein p1+p2+p3 is from 1 to 30.

Examples thereof are

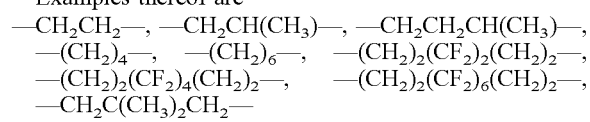

and the like.

Also there are organic groups represented by the formula (R2-1-1):

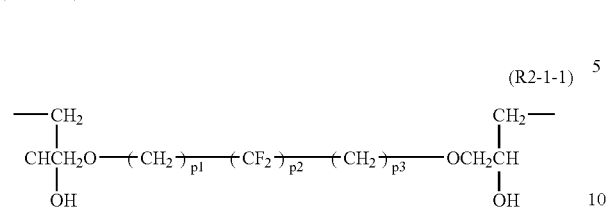
(R2-1-1)

wherein p1, p2 and p3 are as defined in the formula (R2-1).
More concretely there are preferably:

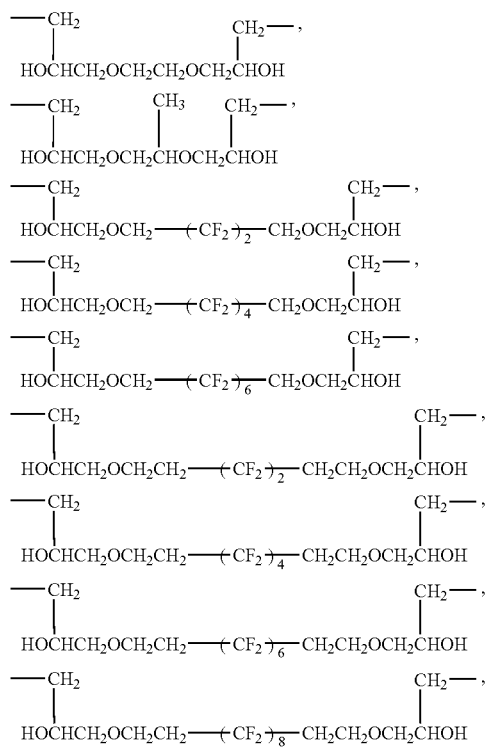

and the like.

Other examples are organic groups represented by the formulae (R2-1-2) and (R2-1-3):

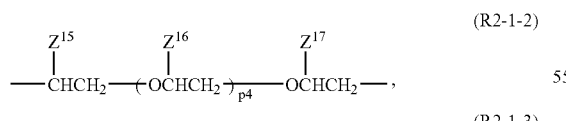
(R2-1-2)

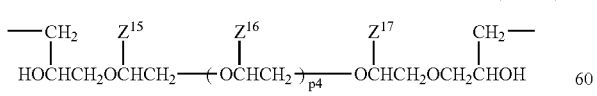
(R2-1-3)

and the like, wherein p4 is 0 or an integer of 1 to 20; $Z^{15}$, $Z^{16}$ and $Z^{17}$ are the same or different and each is H or $CH_3$.

Also in the case of n1=2 or more (trifunctional or more), there are organic groups represented by the formula (R2-2):

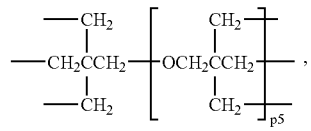
(R2-2)

wherein p5 is 0 or an integer of 1 to 5.
Concretely there are:

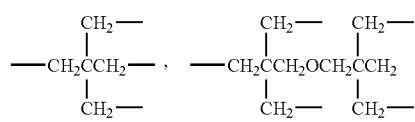

and the like.

Examples other than the formula (R2-2) are, for instance,

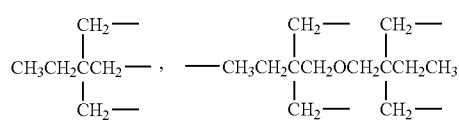

and the like.

Examples of the organic groups having a fluorine-containing alkylene group are those of the formulae (R2-3) and (R2-4):

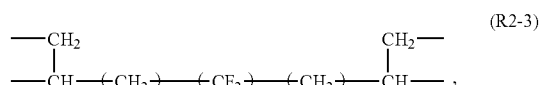
(R2-3)

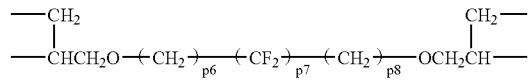
(R2-4)

and the like, wherein p6 and p8 are the same or different and each is an integer of 1 to 10; p7 is an integer of 1 to 30.

Concretely preferred examples thereof are:

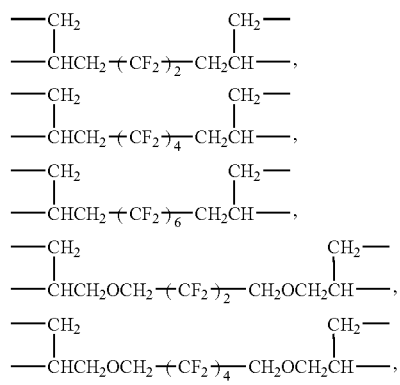

-continued

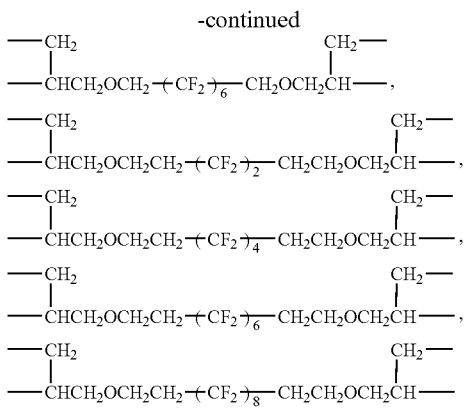

and the like.

The divalent or more organic groups having the linear or branched alkylene group exemplified above are preferred as the $R^2$ because flexibility and elasticity can be imparted to the polymer and also because compatibility with the rare earth metal compound (B) is excellent. Further those organic groups are preferred because when introducing fluorine atom, the fluorine content can be made high, which is advantageous from the viewpoint of an intensity of light emission (amplification) and a light emitting (amplifying) efficiency. (2) (n1+1)-valent organic group having aromatic ring structure There are, for example, divalent organic groups containing a moiety represented by the formula (R2-5):

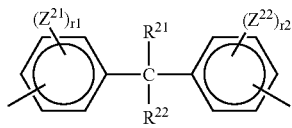

(R2-5)

wherein $R^{21}$ and $R^{22}$ are the same or different and each is an alkyl group having 1 to 5 carbon atoms or a fluorine-containing alkyl group having 1 to 5 carbon atoms; $Z^{21}$ and $Z^{22}$ are the same or different and each is an alkyl group having 1 to 5 carbon atoms, a fluorine-containing alkyl group having 1 to 5 carbon atoms, a functional group, hydrogen atom or halogen atom; r1 and r2 are the same or different and each is an integer of 1 to 4, or divalent organic groups containing a moiety represented by the formula (R2-6):

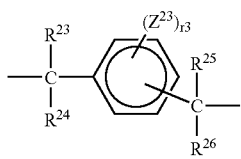

(R2-6)

wherein $R^{23}$, $R^{24}$, $R^{25}$ and $R^{26}$ are the same or different and each is an alkyl group having 1 to 5 carbon atoms or a fluorine-containing alkyl group having 1 to 5 carbon atoms; $Z^{23}$ is an alkyl group having 1 to 5 carbon atoms, a fluorine-containing alkyl group having 1 to 5 carbon atoms, a functional group, hydrogen atom or halogen atom; r3 is an integer of 1 to 4.

In addition, there are divalent organic groups containing a moiety represented by the following formulae (R2-7) to (R2-11).

Formula (R2-7):

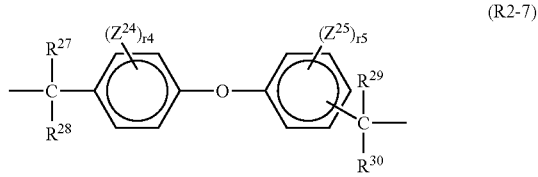

(R2-7)

Formula (R2-8):

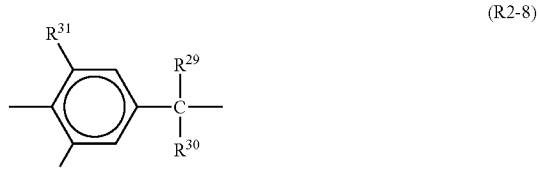

(R2-8)

Formula (R2-9):

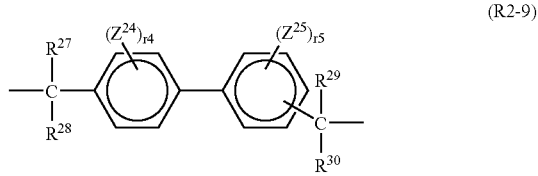

(R2-9)

Formula (R2-10):

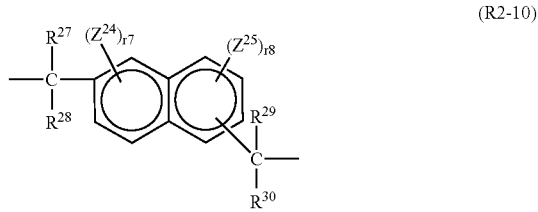

(R2-10)

Formula (R2-11):

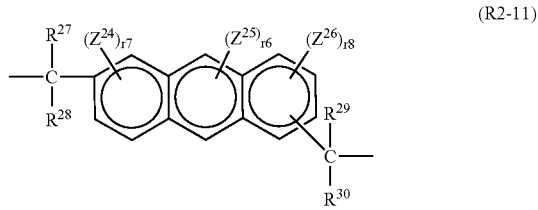

(R2-11)

In the above formulae, $R^{27}$, $R^{28}$, $R^{29}$ and $R^{30}$ are the same or different and each is an allyl group having 1 to 5 carbon atoms or a fluorine-containing alkyl group having 1 to 5 carbon atoms; $R^{31}$ and $R^{32}$ are the same or different and each is an alkyl group having 1 to 5 carbon atoms, a fluorine-containing alkyl group having 1 to 5 carbon atoms or hydrogen atom; $Z^{24}$, $Z^{25}$ and $Z^{26}$ are the same or different and each is an alkyl group having 1 to 5 carbon atoms, a fluorine-containing alkyl group having 1 to 5 carbon atoms, a functional group, hydrogen atom or halogen atom; r4 and r5 are the same or different and each is an integer of 1 to 4; r6 is an integer of 1 to 2; r7 and r8 are the same or different and each is an integer of 1 to 3. In the different formulae, the same symbols can represent different groups or different integers.

Preferred examples of the formula (R2-5) are:

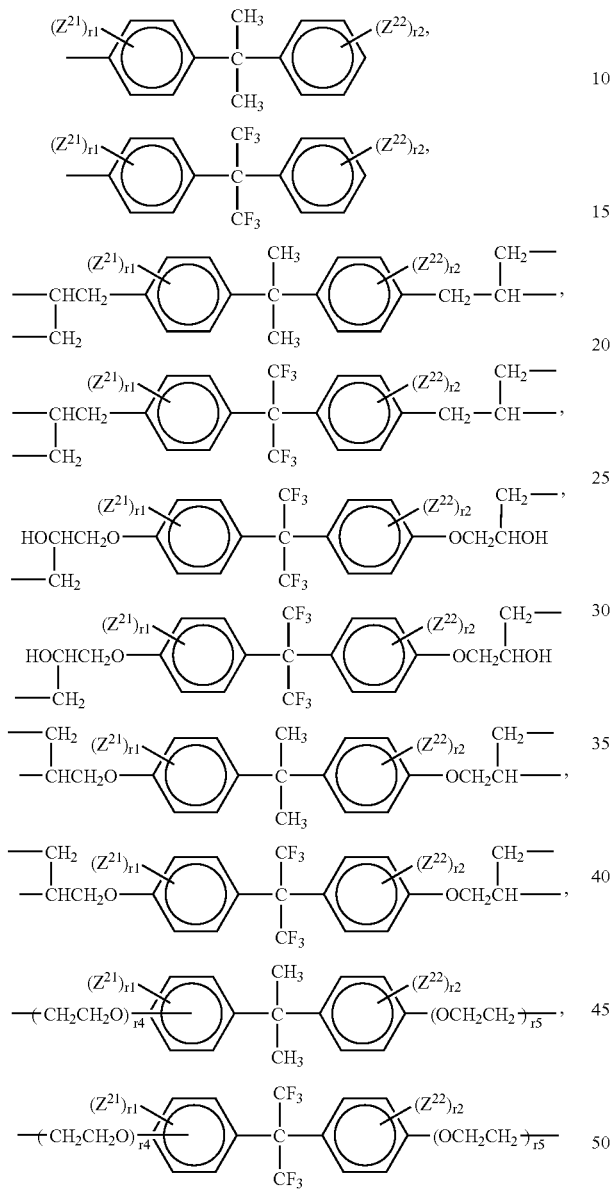

and the like, wherein r4 and r5 are the same or different and each is an integer of 1 to 10; $Z^{21}$, $Z^{22}$, r1 and r2 are as defined in the formula (R2-5).

Preferred examples of the formula (R2-6) are:

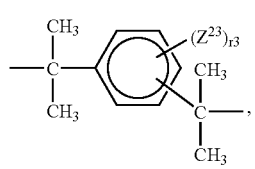

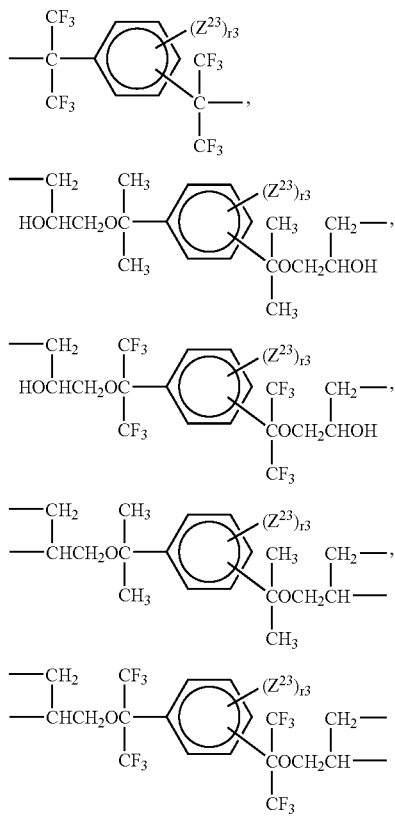

and the like, wherein $Z^{23}$ and r3 are as defined in the formula (R2-6).

Preferred examples of the formula (R2-7) are:

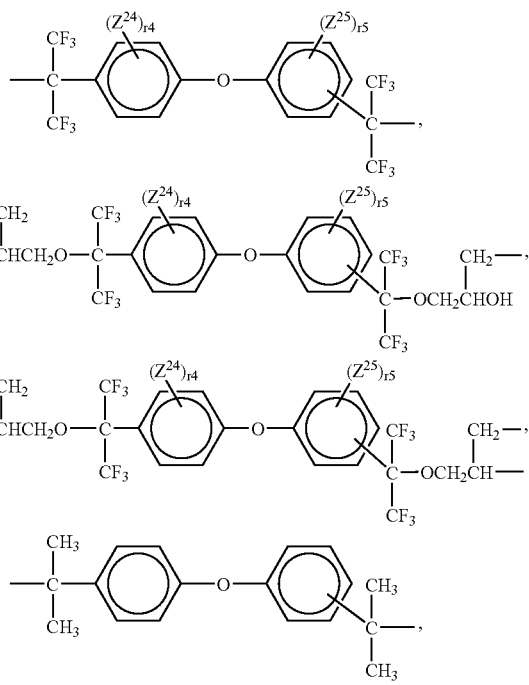

-continued
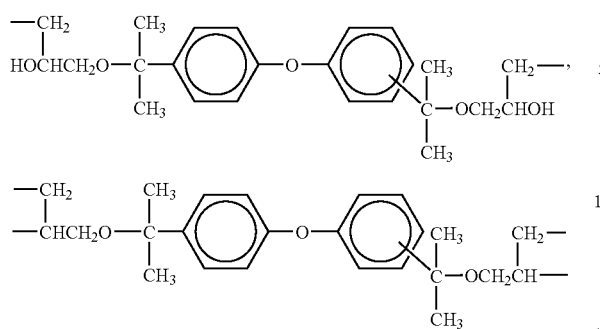
and the like, wherein $Z^{24}$, $Z^{25}$, r4 and r5 are as defined in the formula (R2-7).
Preferred examples of the formula (R2-8) are:
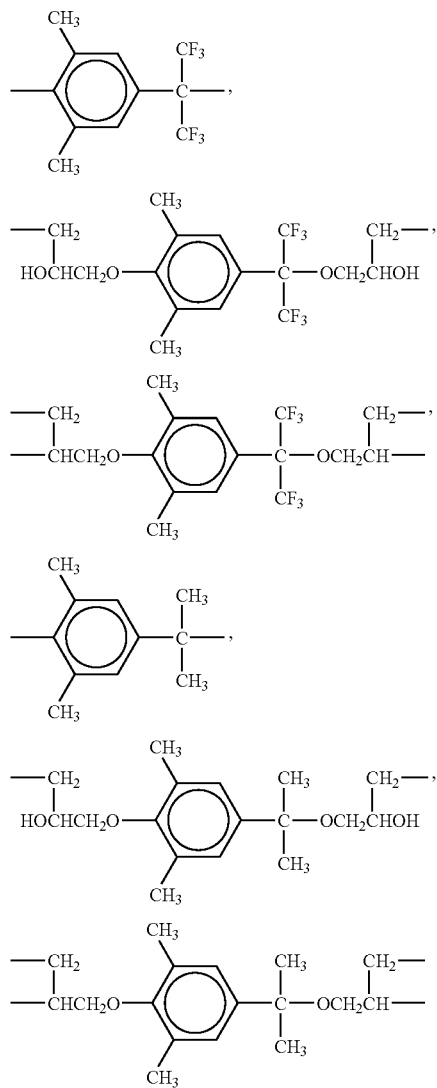
and the like.
Preferred examples of the formula (R2-9) are:
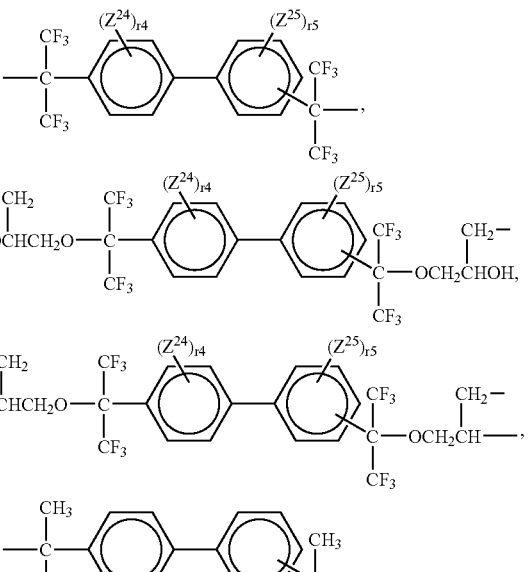
and the like, wherein $Z^{24}$, $Z^{25}$, r4 and r5 are as defined in the formula (R2-9).
Preferred examples of the formula (R2-10) are:
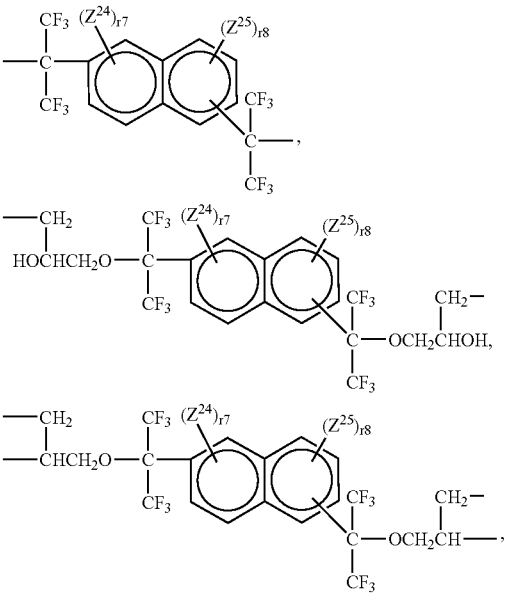

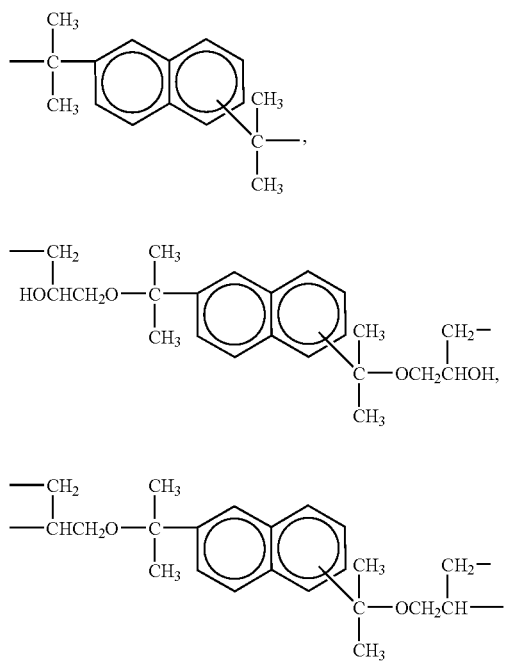

and the like, wherein $Z^{24}$, $Z^{25}$, r7 and r8 are as defined in the formula (R2-10).

Preferred examples of the formula (R2-11) are:

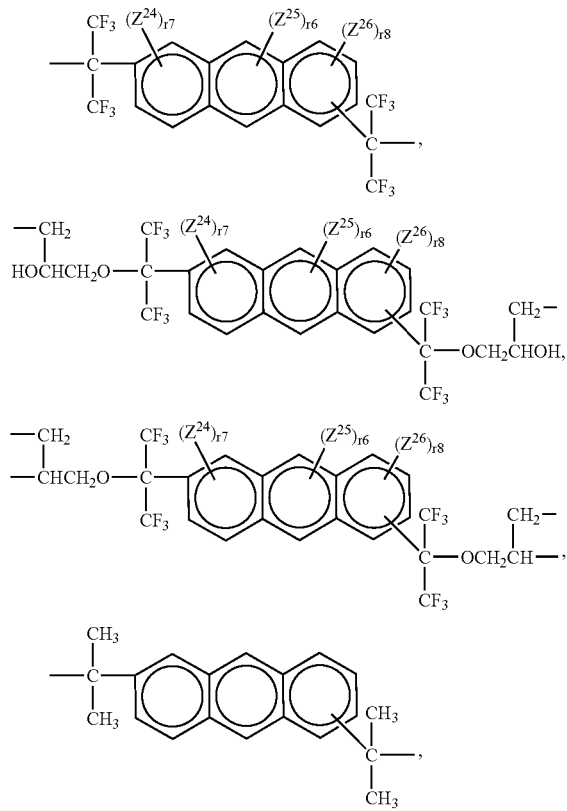

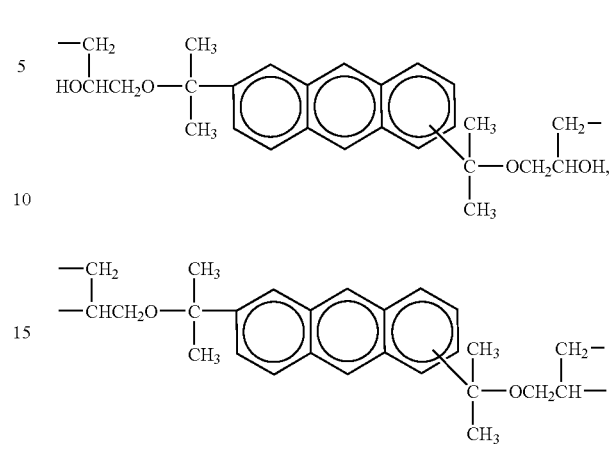

and the like, wherein $Z^{24}$, $Z^{25}$, $Z^{26}$, r6, r7 and r8 are as defined in the formula (R2-11).

Examples of $Z^{21}$, $Z^{22}$, $Z^{23}$, $Z^{24}$, $Z^{25}$ and $Z^{26}$ are, for instance, hydrogen atom, fluorine atom, methyl and the like.

Those divalent or more organic groups having the aromatic ring structure are preferred because heat resistance and mechanical properties are excellent and a glass transition temperature can be set high and as a result, an intensity of light emission (amplification) and a light emitting (amplifying) efficiency can be enhanced.

Among them, those having fluorine atom are preferred because transparency to light of a near infrared region is high at light amplification for communication and also because the introduction of fluorine atom functions effectively for a light emitting efficiency and a light amplifying efficiency.

(3) (n1+1)-valent Organic Group having Aliphatic Ring (Monocyclic or Polycyclic) Structure There are, for example, divalent organic groups containing a moiety represented by the formula (R2-12):

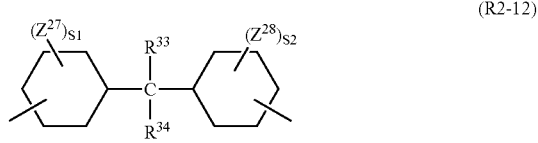

(R2-12)

wherein $R^{33}$ and $R^{34}$ are the same or different and each is an alkyl group having 1 to 5 carbon atoms or a fluorine-containing alkyl group having 1 to 5 carbon atoms; $Z^{27}$ and $Z^{28}$ are the same or different and each is an alkyl group having 1 to 5 carbon atoms, a fluorine-containing alkyl group having 1 to 5 carbon atoms, a functional group, hydrogen atom or halogen atom; s1 and s2 are the same or different and each is an integer of 1 to 4, or divalent organic groups containing a moiety represented by the formula (R2-13):

Formula (R2-13):

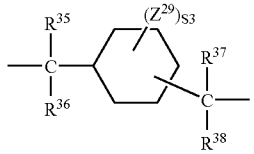

wherein $R^{35}$, $R^{36}$, $R^{37}$ and $R^{38}$ are the same or different and each is an alkyl group having 1 to 5 carbon atoms or a fluorine-containing alkyl group having 1 to 5 carbon atoms; $Z^{29}$ is an alkyl group having 1 to 5 carbon atoms, a fluorine-containing alkyl group having 1 to 5 carbon atoms, a functional group, hydrogen atom or halogen atom; s3 is an integer of 1 to 4.

In addition, there are divalent organic groups containing a moiety represented by the following formulae (R2-14) to (R2-18).

Formula (R2-14):

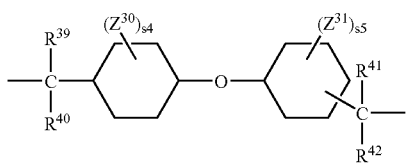

Formula (R2-15):

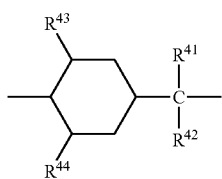

Formula (R2-16):

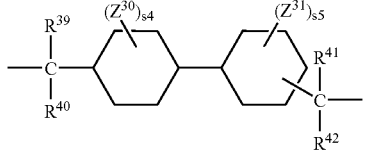

Formula (R2-17):

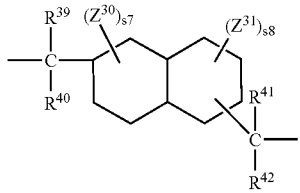

Formula (R2-18):

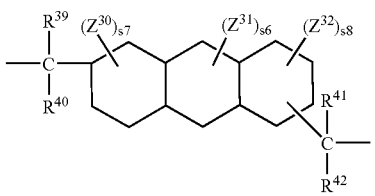

In the above formulae, $R^{39}$, $R^{40}$, $R^{41}$ and $R^{42}$ are the same or different and each is an alkyl group having 1 to 5 carbon atoms or a fluorine-containing alkyl group having 1 to 5 carbon atoms; $R^{43}$ and $R^{44}$ are the same or different and each is an alkyl group having 1 to 5 carbon atoms, a fluorine-containing alkyl group having 1 to 5 carbon atoms or hydrogen atom; $Z^{30}$, $Z^{31}$ and $Z^{32}$ are the same or different and each is an alkyl group having 1 to 5 carbon atoms, a fluorine-containing alkyl group having 1 to 5 carbon atoms, a functional group, hydrogen atom or halogen atom; s4 and s5 are the same or different and each is an integer of 1 to 4; s6 is an integer of 1 to 2; s7 and s8 are the same or different and each is an integer of 1 to 3. In the different formulae, the same symbols can represent different groups or different integers.

Preferred examples of the formula (R2-12) are:

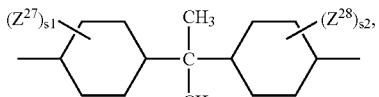

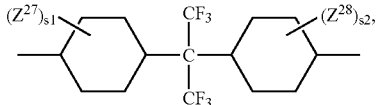

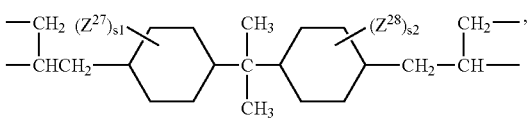

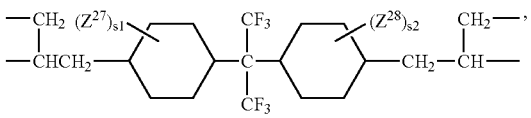

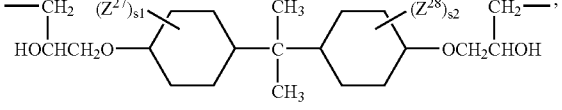

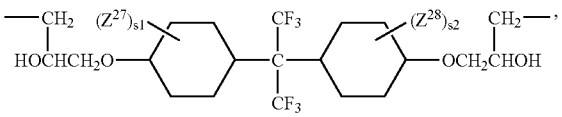

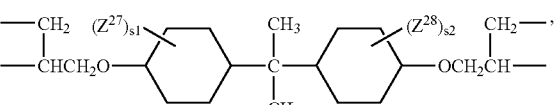

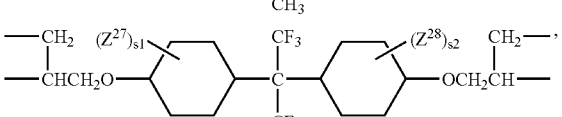

-continued

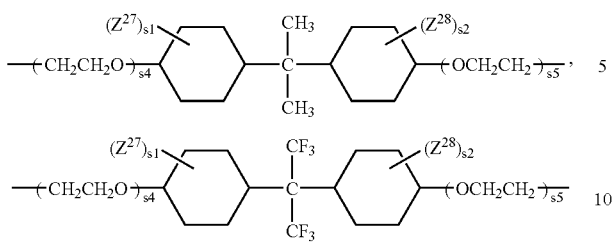

and the like, wherein s4 and s5 are the same or different and each is an integer of 1 to 10; $Z^{27}$, $Z^{28}$, s1 and s2 are as defined in the formula (R2-12).

Preferred examples of the formula (R2-13) are:

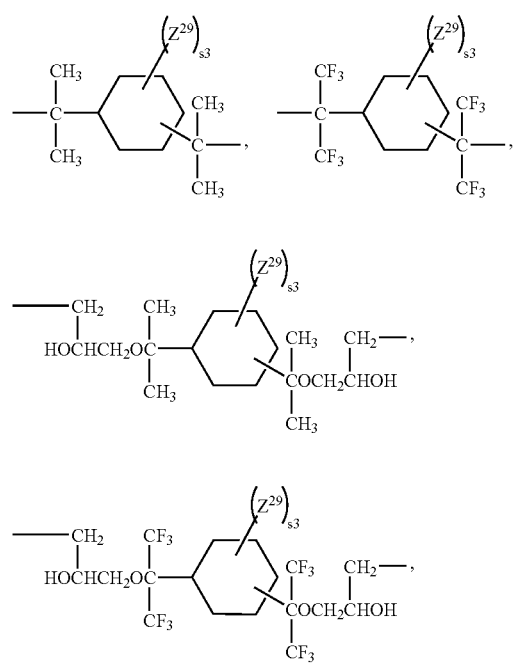

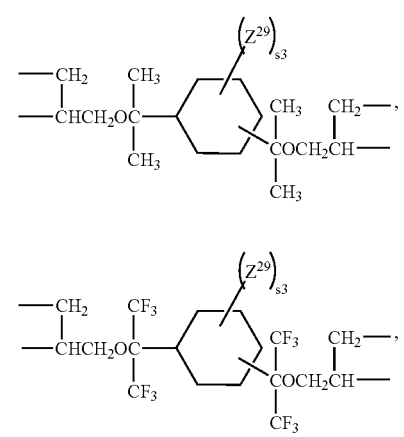

and the like, wherein $Z^{29}$ and s3 are as defined in the formula (R2-13).

Preferred examples of the formula (R2-14) are:

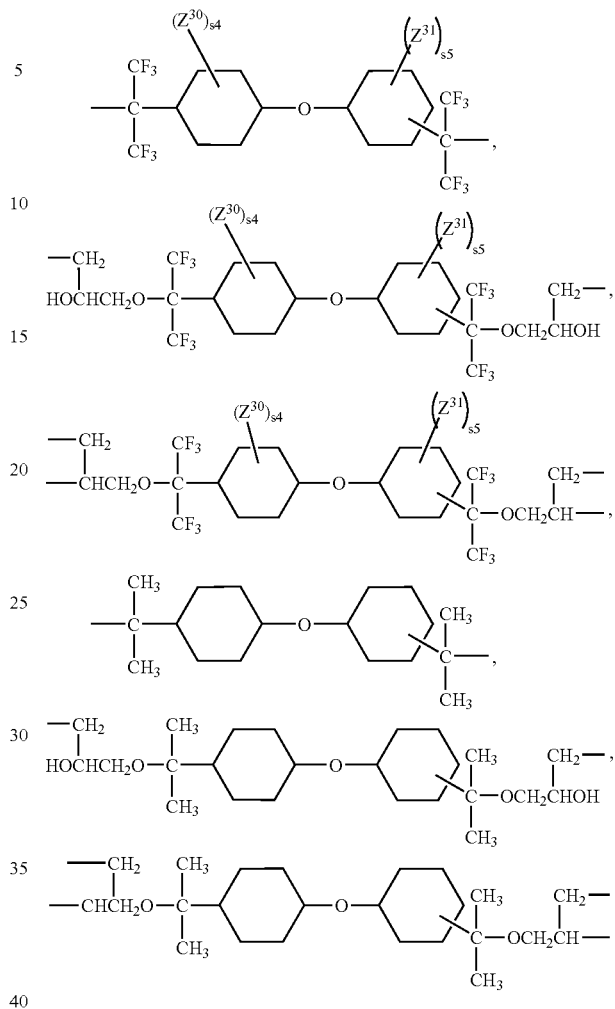

and the like, wherein $Z^{30}$, $Z^{31}$, s4 and s5 are as defined in the formula (R2-14).

Preferred examples of the formula (R2-15) are:

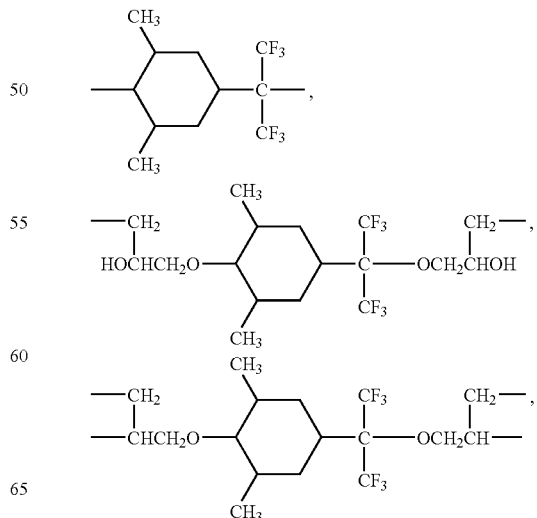

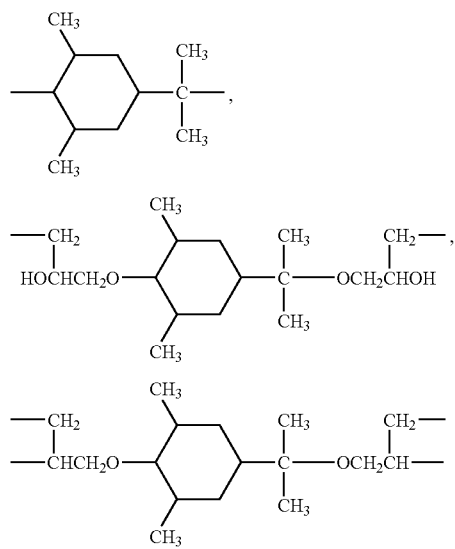
and the like.
Preferred examples of the formula (R2-16) are:
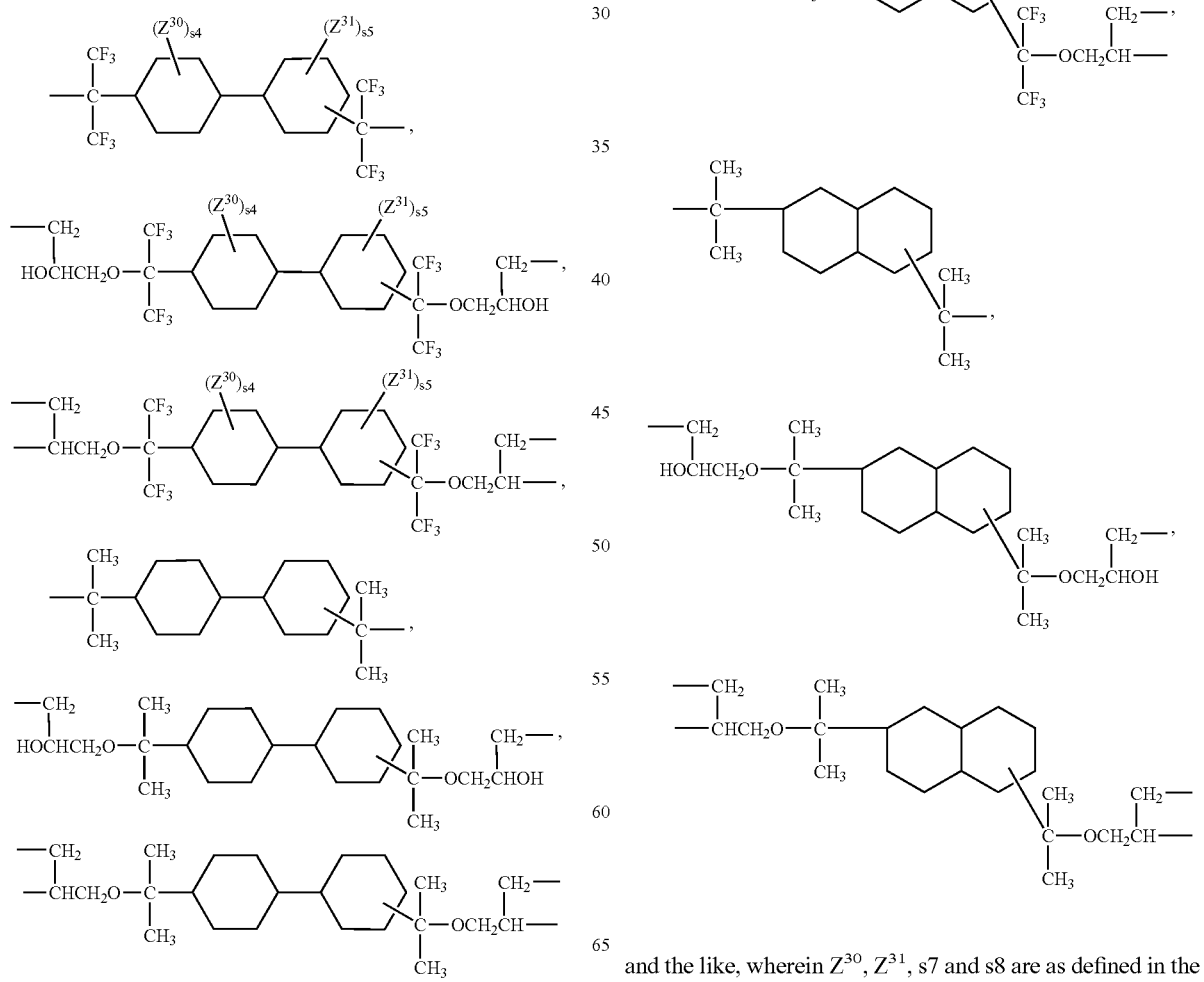
and the like, wherein $Z^{30}$, $Z^{31}$, s4 and s5 are as defined in the formula (R2-16).
Preferred examples of the formula (R2-17) are:
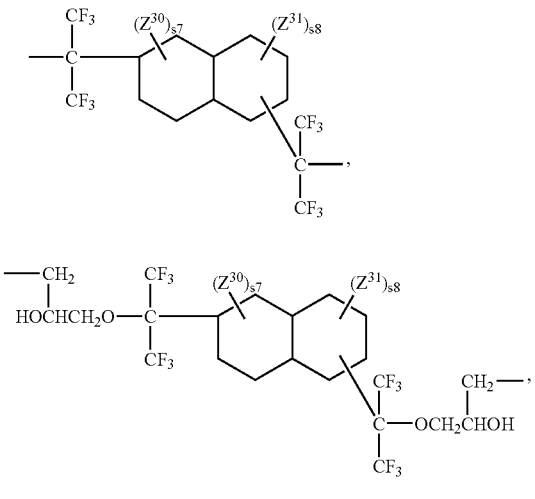
and the like, wherein $Z^{30}$, $Z^{31}$, s7 and s8 are as defined in the formula (R2-17).

Preferred examples of the formula (R2-18) are:

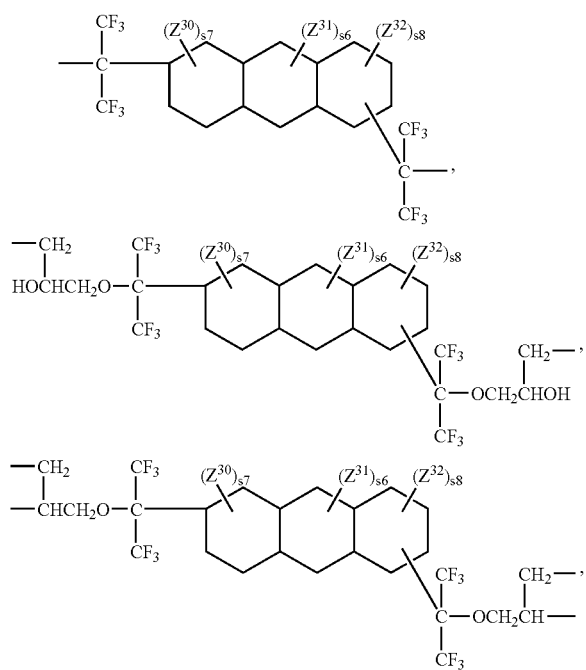

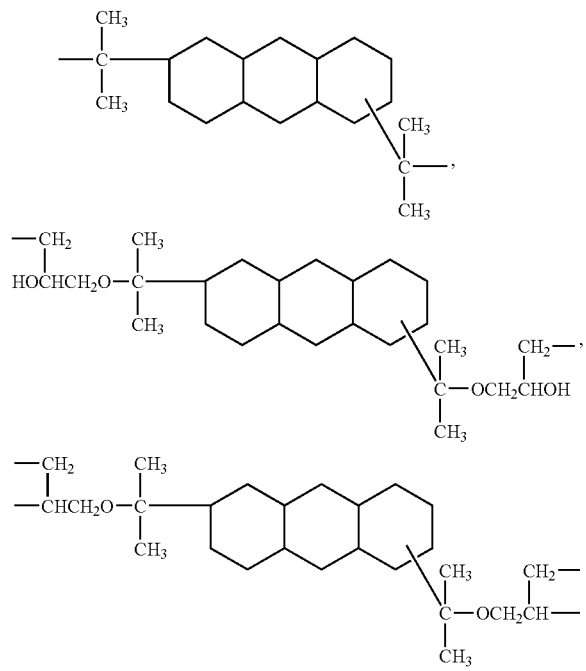

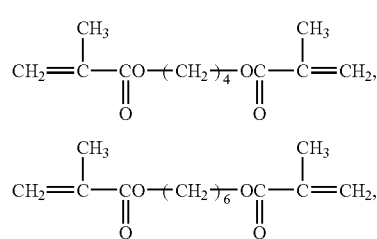

and the like, wherein $Z^{30}$, $Z^{31}$, $Z^{32}$, s6, s7 and s8 are as defined in the formula (R2-18).

Examples of $Z^{27}$, $Z^{28}$, $Z^{29}$, $Z^{30}$, $Z^{31}$ and $Z^{32}$ are, for instance, hydrogen atom, fluorine atom, methyl and the like.

Those divalent or more organic groups having the aliphatic ring structure are preferred because a glass transition temperature can be set high and heat resistance and mechanical properties are excellent and also because transparency to ultraviolet light usually used as an excitation light for light emission is high and as a result, an intensity of light emission (amplification) and a light emitting (amplifying) efficiency can be enhanced. Also those groups are preferred because of excellent resistance to ultraviolet light.

Among them, those having fluorine atom are preferred because transparency to light of a near infrared region is high at light amplification for communication and also because the introduction of fluorine atom functions effectively for a light emitting efficiency and a light amplifying efficiency.

(4) (n1+1)-valent Organic Group having Urethane Bond

Examples thereof are organic groups represented by:

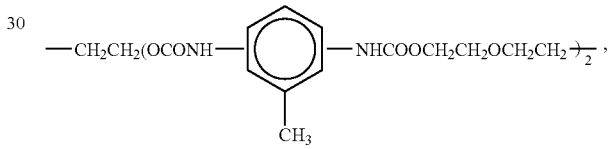

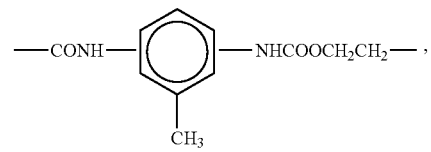

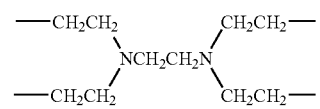

and the like.

While explanation is made above mainly with respect to $R^2$, examples of the polyfunctional acrylate (a1-2) represented by the formula (4) are polyfunctional acrylate compounds exemplified below.

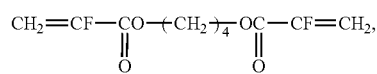

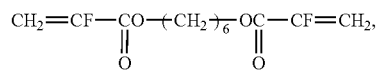

-continued
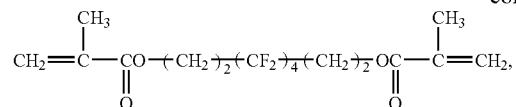
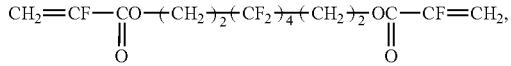
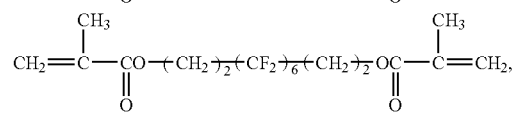
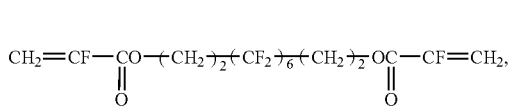
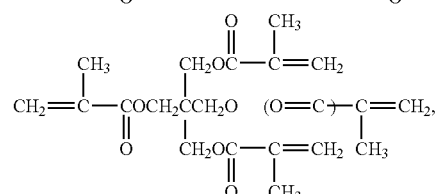
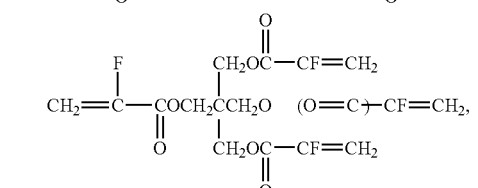
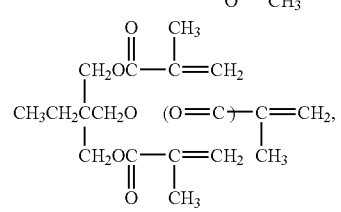
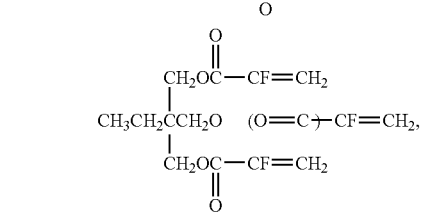
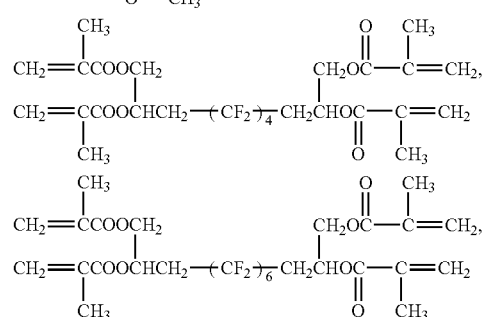
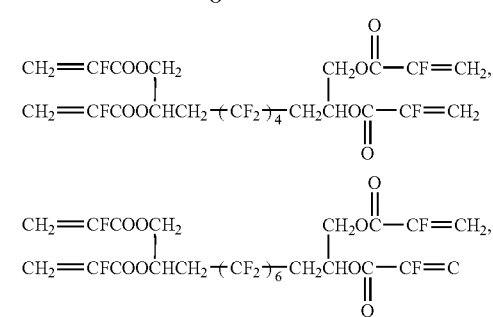
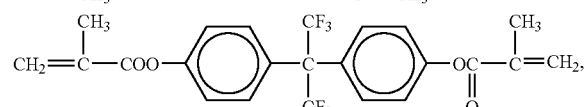
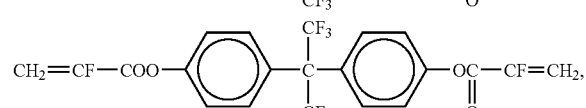
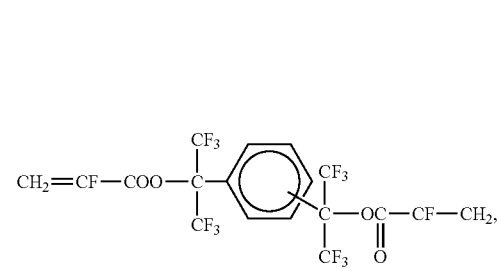
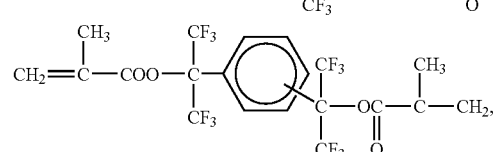
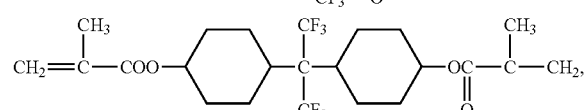
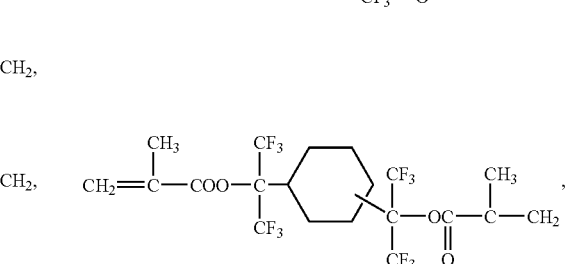
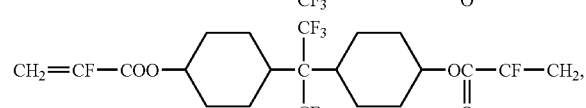
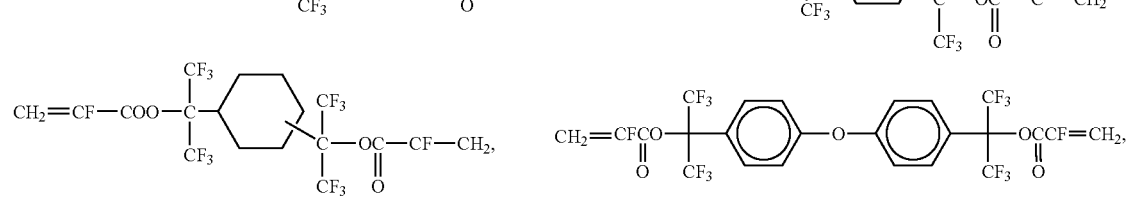
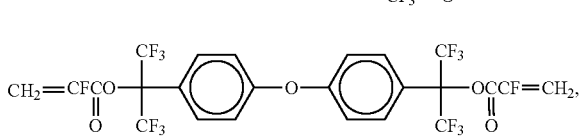

-continued
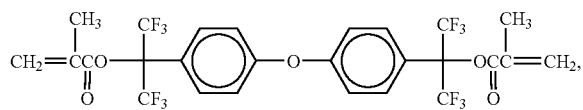
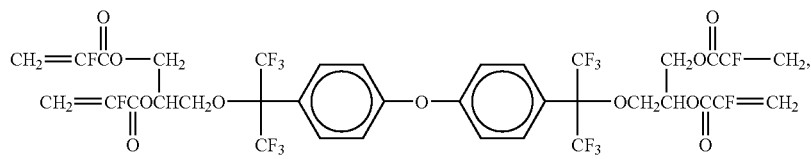
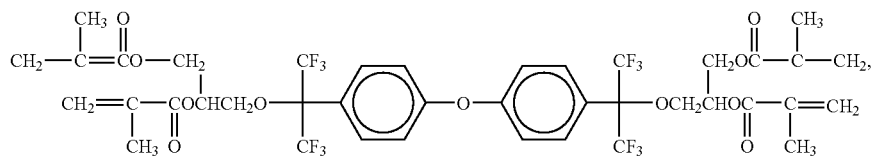
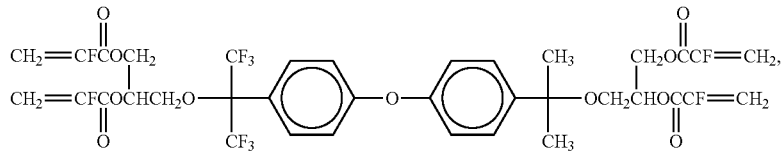
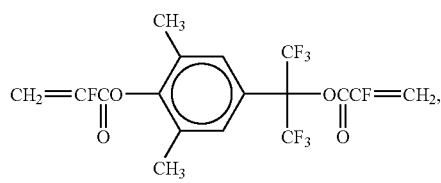
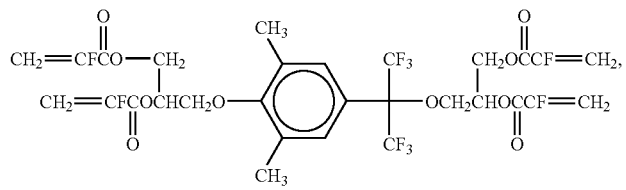
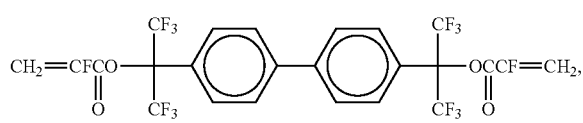
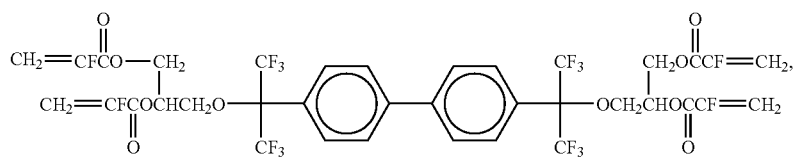
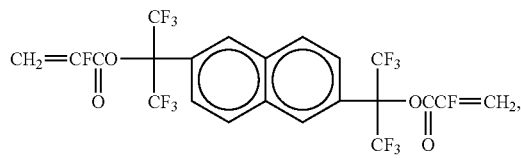
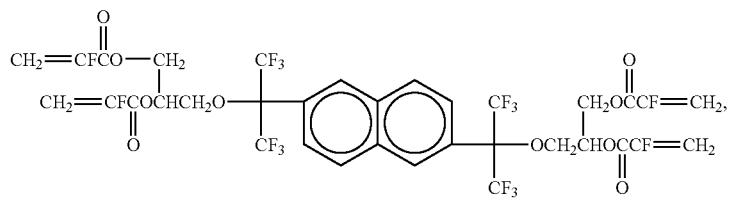

-continued
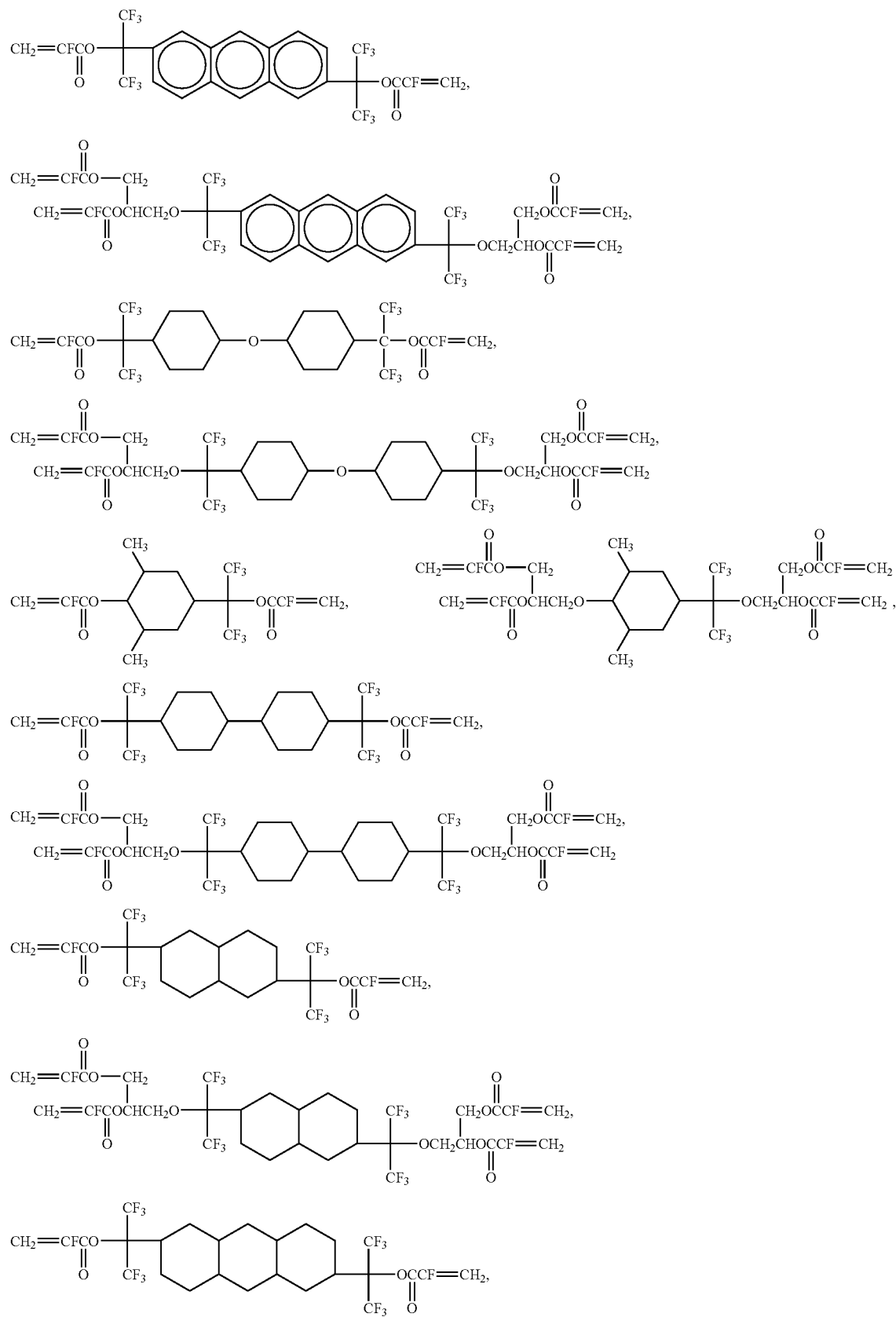

-continued

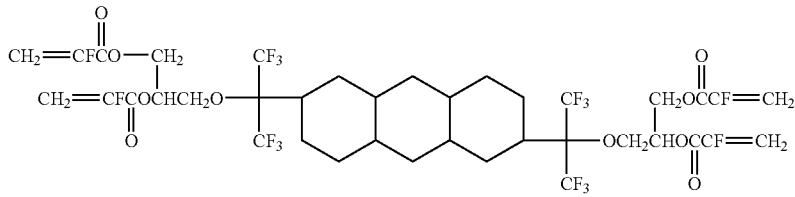

To the fluorine-containing acrylate polymer (A1-III) to be used for the photofunctional laminated article of the present invention may be introduced, as case demands, the optional structural unit N by copolymerizing the optional monomer (n) in addition to the fluorine-containing acrylate (a1-1) and the polyfunctional acrylate (a1-2).

The optional monomer (n) is not limited as long as it is copolymerizable with (a1-1) and (a1-2), and is usually selected from acrylate monomers other than (a1-1) and (a1-2), (meth)acrylic acids, fluorine-containing acrylic acids, maleic acid derivatives, vinyl chloride, ethylenes, styrene derivatives, norbornene derivatives and the like. The monomer (n) is introduced within a range not decreasing a fluorine content excessively.

The optional structural unit N is introduced, for example, for the purposes of improving dispersibility of and compatibility with the rare earth metal compound (B), adhesion to a substrate, adhesion to a substrate of other material, heat resistance and mechanical properties and adjusting a refractive index and transparency.

It is preferable that the structural unit N is selected from structural units derived from monomers such as acrylate monomers other than (a1-1) and (a1-2), (meth)acrylic acids, fluorine-containing (meth)acrylic acids and maleic acid derivatives.

Preferred examples of the acrylate monomer are (meth)acrylate monomers having a linear or branched alkyl group having 1 to 20 carbon atoms in the side chain thereof such as methyl methacrylate (MMA), methyl acrylate (MA), ethyl methacrylate (EMA), ethyl acrylate (EA), isopropyl methacrylate, isopropyl acrylate, butyl methacrylate, butyl acrylate, hexyl methacrylate, hexyl acrylate, octadecyl methacrylate and octadecyl acrylate.

Also there are (meth)acrylate monomers having functional group such as hydroxyl, epoxy or carboxyl in the side chain thereof such as hydroxyethyl methacrylate (HEMA), hydroxyethyl acrylate, glycidyl methacrylate (GMA) and glycidyl acrylate.

Also there are (meth)acrylate monomers which have, in the side chain thereof, a hydrocarbon group having 3 to 20 carbon atoms and containing an aromatic ring structure, for example, (meth)acrylate monomers having a benzene ring structure, naphthyl ring structure, heterocyclic structure or the like in the side chain thereof such as phenyl methacrylate, phenyl acrylate, benzyl methacrylate, benzyl acrylate, naphthyl methacrylate and naphthyl acrylate.

Also there are (meth)acrylate monomers which have, in the side chain thereof, a hydrocarbon group having 3 to 20 carbon atoms and containing an aliphatic ring structure, for example, (meth)acrylate monomers having a cyclohexyl structure, norbornane structure, decalin structure, adamantyl structure or the like in the side chain thereof such as cyclohexyl methacrylate, cyclohexyl acrylate, adamantyl methacrylate, adamantyl acrylate, methyl adamantyl methacrylate, methyl adamantyl acrylate, ethyl adamantyl methacrylate and ethyl adamantyl acrylate.

Examples of the (meth)acrylic acids and fluorine-containing (meth)acrylic acids are, for instance, methacrylic acids, acrylic acids, α-fluoroacrylic acids, α-trifluoromethyl acrylic acids and the like.

Preferred examples of the maleic acid derivatives are maleic acid, maleic anhydride, maleic acid monoesters (for example, maleic acid monomethyl ester, maleic acid monoethyl ester, maleic acid monopropyl ester and the like), maleic acid diesters (for example, maleic acid dimethyl ester, maleic acid diethyl ester, maleic acid dipropyl ester and the like) and the like.

The fluorine-containing acrylate polymer to be used for the photofunctional laminated article of the present invention is prepared by polymerizing the fluorine-containing acrylate (a1-1) and the polyfunctional acrylate (a1-2), and contains, as essential components, the structural unit A1-1 derived from the monomer (a1-1) and the structural unit A1-2 derived from the monomer (a1-2). The structural unit A1-1 and the structural unit A1-2 are contained in amounts of from 20 to 99.9% by mole and from 0.1 to 80% by mole, respectively.

The fluorine-containing acrylate polymer to be used for the photofunctional laminated article of the present invention is characterized by containing the structural unit A1-2 of the polyfunctional acrylate (a1-2), thereby enabling an intensity of light emission (amplification) and a light emitting (amplifying) efficiency of the photofunctional laminated article to be enhanced remarkably.

On the other hand, by the introduction of the structural unit A1-1, the fluorine content of the polymer can be increased, thereby enabling an intensity of light emission (amplification) and a light emitting (amplifying) efficiency of the photofunctional laminated article to be further enhanced.

The fluorine content of the fluorine-containing acrylate polymer of the present invention is preferably not less than 20% by mass, more preferably not less than 30% by mass, particularly preferably not less than 50% by mass.

The preferred proportions of the structural units A1-1 and A1-2 vary depending on kinds of the monomers (a1-1) and (a1-2), and a molar ratio of the structural unit A1-1/A1-2 is 30/70 to 99/1, more preferably 40/60 to 98/2, particularly preferably 50/50 to 95/5.

If the proportion of the structural unit A1-1 is too small, there is a tendency that the fluorine content in the fluorine-containing acrylate polymer (A1) is decreased, and a sufficient intensity of light emission (amplification) and a sufficient light emitting (amplifying) efficiency are difficult to obtain.

If the proportion of the structural unit A1-2 is too small, there is a tendency that it becomes difficult to inhibit motions of the polymer molecules themselves, and as a result, a sufficient intensity of light emission (amplification) and a sufficient light emitting (amplifying) efficiency are difficult to obtain.

On the contrary, if the proportion of the structural unit A1-2 is too large, there is a tendency that mechanical properties of the fluorine-containing acrylate polymer (A1) are lowered, for example, the polymer becomes fragile and compatibility with the rare earth metal compound (B) is lowered, thereby causing phase separation and lowering effects on an intensity of light emission (amplification) and a light emitting (amplifying) efficiency.

The optional structural unit N is introduced to an extent not impairing effects on an intensity of light emission (amplification) and a light emitting (amplifying) efficiency by the structural units A1-1 and A1-2. It is usually preferable that the proportion of the structural unit N is not more than 60% by mole, preferably not more than 50% by mole, more preferably not more than 30% by mole, particularly not more than 10% by mole based on the whole monomers in the fluorine-containing acrylate polymer (A1).

In the photofunctional laminated article of the present invention, the second of the preferred fluorine-containing polymer (A) in the photofunctional layer (L1) is the fluorine-containing polymer (A2) having a curable moiety in its side chain or at an end of its trunk chain.

Preferred examples of the fluorine-containing polymer (A2) having a curable moiety are the same as those exemplified in WO02/72706 and WO2004/016689.

Further in the photofunctional laminated article of the present invention, the third of the preferred fluorine-containing polymer (A) in the photofunctional layer (L1) is the fluorine-containing polymer (A3) having, in its side chain or at an end of its trunk chain, a functional group being capable of coordination bonding or being capable of forming a complex with the rare earth metal ion in the rare earth metal compound (B) used in the photofunctional layer (L1).

Preferred examples of the fluorine-containing polymer (A3) having a functional group being capable of forming a complex are the same as those exemplified in WO02/72696 and WO03/91343.

Next, the rare earth metal compound used for the photofunctional layer (L1) in the photofunctional laminated article of the present invention is explained below.

The rare earth element to be used for the rare earth metal compound (B) is at least one kind selected from scandium elements excluding actinium and 17 elements of lanthanoid in Periodic Table. Among them, preferred are erbium (Er), thulium (Tm), praseodymium (Pr), holmium (Ho), neodymium (Nd), europium (Eu), cerium (Ce), samarium (Sm), dysprosium (Dy), terbium (Tb) and the like.

Kind of the rare earth element to be used is selected from the above-mentioned elements depending on applications such as light emission, light amplification and conversion of wavelength and also depending on kind (wavelength) of required light.

For example, in light amplification application in optical communication using near infrared light of 1,300 to 1,550 nm wavelength, it is preferable to select from rare earth elements having an ability of generating fluorescence of near infrared region.

Concretely there are rare earth elements such as praseodymium (fluorescence wavelength: 1,300 nm) and erbium (fluorescence wavelength: 1,550 nm). In a light amplification application in optical communication using near infrared light of 850 nm wavelength, neodymium (fluorescence wavelength: 850 nm) is preferred. In a light amplification application in optical communication using visible light of 650 nm wavelength, europium (fluorescence wavelength: 615 nm) or the like is preferred.

In applications to light emission device and wavelength conversion material, a rare earth element generating light of necessary wavelength as a fluorescence is selected.

For example, in light emission application, it is preferable to select from terbium (fluorescence wavelength: 532 nm) emitting green light, europium (fluorescence wavelength: 615 nm) emitting red light and the like.

The rare earth metal compound (B) in the photofunctional laminated article of the present invention means (B1) a rare earth metal complex (in a state of forming a complex with a ligand), (B2) an inorganic phosphor activated with rare earth element (in a state of being activated in an inorganic salt) and (B3) a rare earth metal ion (in a state of being present in the form of usual ion bonding), and preferred are a rare earth metal complex and an inorganic phosphor activated with rare earth element. Especially preferred is a rare earth metal complex.

Each rare earth metal compound is then explained below.

(B1) Rare Earth Metal Complex

The rare earth metal complex is preferred because its light emitting (amplifying) efficiency is high and also because of excellent dispersibility in and compatibility with the fluorine-containing polymer (A).

Namely, the rare earth metal complex usually contains at least one ligand bonded to the rare earth element by coordination, and unlike a rare earth metal ion, the rare earth element is surrounded by ligands. Therefore in the light emitting process of the excited rare earth element, the stored energy of the rare earth element is inhibited from escaping to the ambient matrix molecules (polymer molecules and the like), and as a result, an intensity and efficiency of light emission from the rare earth metal are increased.

As long as the ligands of the rare earth metal complex contain an atom having π-electron (for example, hetero atoms or the like) or an unsaturated bond, any of inorganic and organic ligands may be used, and organic compounds having carbon-carbon double bond, carbon-hetero atom double bond or hetero atom-hetero atom double bond are preferred especially because of excellent dispersibility in and compatibility with the fluorine-containing polymer (A) to be used in the present invention.

Further it is preferable that the rare earth metal complex contains electric charge compensation type ligands forming an anion to form a coordination bond and ion bond with rare earth metal ion (cation), because stability, heat resistance and resistance to ultraviolet light of the rare earth metal complex are excellent.

Examples of the electric charge compensation type ligand are, for instance, ligands having a structural unit represented by the formula (b1):

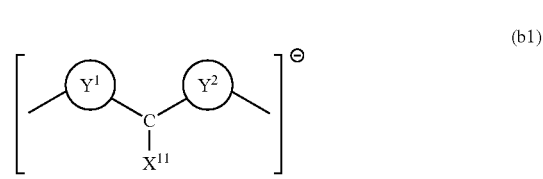

wherein $Y^1$ and $Y^2$ are the same or different and each is

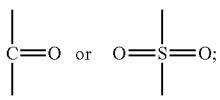

$X^{11}$ is selected from hydrogen atom, heavy hydrogen atom, fluorine atom, hydrocarbon groups having 1 to 20 carbon atoms and fluorine-containing hydrocarbon groups having 1 to 20 carbon atoms in which a part or the whole of hydrogen atoms are replaced by fluorine atoms, ligands having a structural unit represented by the formula (b2):

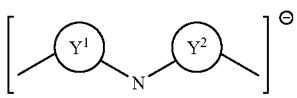

wherein $Y^1$ and $Y^2$ are as defined in the formula (b1), and ligands having a structural unit represented by the formula (b3):

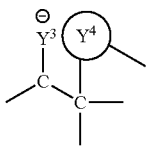

wherein $Y^3$ is selected from O, S and N—R' (R' is selected from hydrogen atom, hydrocarbon groups having 1 to 20 carbon atoms and fluorine-containing hydrocarbon groups having 1 to 20 carbon atoms in which a part or the whole of hydrogen atoms are replaced by fluorine atoms); $Y^4$ is at least one selected from

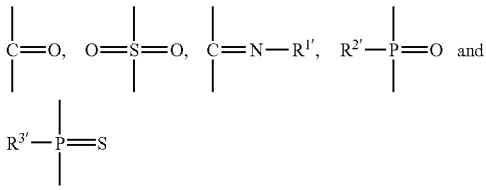

$R^{1'}$ is selected from hydrogen atom, hydrocarbon groups having 1 to 20 carbon atoms and fluorine-containing hydrocarbon groups having 1 to 20 carbon atoms in which a part or the whole of hydrogen atoms are replaced by fluorine atoms, and $R^{1'}$ may form a ring structure with the carbon atom in C=N; $R^{2'}$ and $R^{3'}$ are the same or different and each is selected from hydrocarbon groups having 1 to 20 carbon atoms and fluorine-containing hydrocarbon groups having 1 to 20 carbon atoms in which a part or the whole of hydrogen atoms are replaced by fluorine atoms, and $R^{2'}$ and $R^{3'}$ may form a ring structure with phosphorous atom.

Examples of the ligand having the structure of the formula (b1) are, for instance, those raised below.

(b1-1) Ligands having β-diketone Structure

Those ligands are concretely represented by the formula (b1-1):

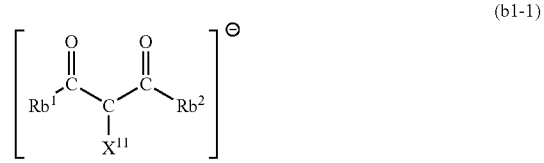

wherein $Rb^1$ and $Rb^2$ are the same or different and each is at least one selected from hydrocarbon groups having 1 to 20 carbon atoms, fluorine-containing hydrocarbon groups having 1 to 20 carbon atoms in which a part or the whole of hydrogen atoms are replaced by fluorine atoms and hydrocarbon groups having 1 to 20 carbon atoms and containing a heterocyclic structure; $X^{11}$ is as defined in the formula (b1). Those ligands are preferred because of good light emitting efficiency, good amplifying efficiency and good compatibility of the formed complex with the fluorine-containing acrylate polymer (A).

Examples thereof are:

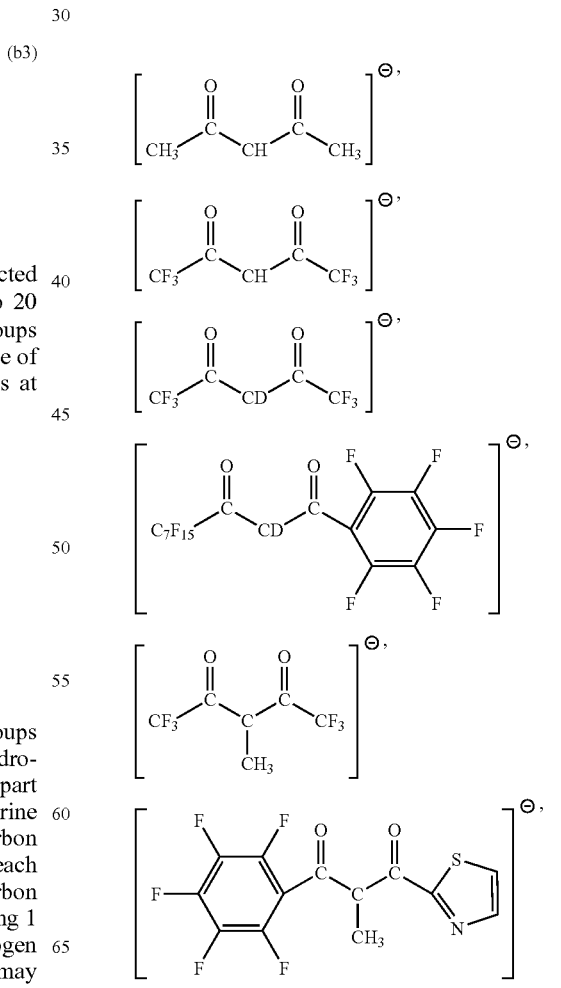

-continued

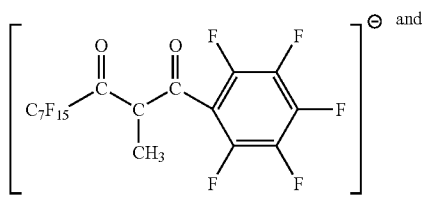

and among them, $$\left[ CF_3-\overset{O}{\underset{\|}{C}}-CD-\overset{O}{\underset{\|}{C}}-CF_3 \right]^{\ominus},$$

$$\left[ C_7F_{15}-\overset{O}{\underset{\|}{C}}-CD-\overset{O}{\underset{\|}{C}}-\text{(C}_6F_4\text{F)} \right]^{\ominus},$$

$$\left[ C_7F_{15}-\overset{O}{\underset{\|}{C}}-\underset{CH_3}{\overset{|}{C}}-\overset{O}{\underset{\|}{C}}-\text{(C}_6F_4\text{F)} \right]^{\ominus},$$

$$\left[ \text{(C}_6F_4\text{F)}-\overset{O}{\underset{\|}{C}}-\underset{CH_3}{\overset{|}{C}}-\overset{O}{\underset{\|}{C}}-\text{(thiazole)} \right]^{\ominus} \text{ and}$$

$$\left[ C_7F_{15}-\overset{O}{\underset{\|}{C}}-\underset{F}{\overset{|}{C}}-\overset{O}{\underset{\|}{C}}-\text{(C}_6F_4\text{F)} \right]^{\ominus}$$

are preferred.

(b1-2) Ligands having β-disulfonyl Structure

Those ligands are concretely represented by the formula (b1-2):

$$\left[ Rb^1-\overset{O}{\underset{O}{\overset{\|}{S}}}-\underset{X^{11}}{\overset{|}{C}}-\overset{O}{\underset{O}{\overset{\|}{S}}}-Rb^2 \right]^{\ominus} \quad \text{(b1-2)}$$

wherein $Rb^1$ and $Rb^2$ are as defined in the formula (b1-1); $X^{11}$ is as defined in the formula (b1). Those ligands are preferred because of good light emitting efficiency, good amplifying efficiency and good compatibility of the formed complex with the fluorine-containing acrylate polymer (A).

Examples thereof are:

$$\left[ CH_3-\overset{O}{\underset{O}{\overset{\|}{S}}}-CH-\overset{O}{\underset{O}{\overset{\|}{S}}}-CH_3 \right]^{\ominus},$$

$$\left[ CF_3-\overset{O}{\underset{O}{\overset{\|}{S}}}-CH-\overset{O}{\underset{O}{\overset{\|}{S}}}-CF_3 \right]^{\ominus},$$

$$\left[ CF_3-\overset{O}{\underset{O}{\overset{\|}{S}}}-CD-\overset{O}{\underset{O}{\overset{\|}{S}}}-CF_3 \right]^{\ominus},$$

$$\left[ CF_3-\overset{O}{\underset{O}{\overset{\|}{S}}}-\underset{CH_3}{\overset{|}{C}}-\overset{O}{\underset{O}{\overset{\|}{S}}}-CF_3 \right]^{\ominus},$$

$$\left[ \text{(C}_6F_4\text{F)}-\overset{O}{\underset{O}{\overset{\|}{S}}}-\underset{CH_3}{\overset{|}{C}}-\overset{O}{\underset{O}{\overset{\|}{S}}}-C_7F_{15} \right]^{\ominus},$$

$$\left[ \text{(C}_6F_4\text{F)}-\overset{O}{\underset{O}{\overset{\|}{S}}}-\underset{CH_3}{\overset{|}{C}}-\overset{O}{\underset{O}{\overset{\|}{S}}}-\text{(thiazole)} \right]^{\ominus},$$

$$\left[ \text{(C}_6F_4\text{F)}-\overset{O}{\underset{O}{\overset{\|}{S}}}-CD-\overset{O}{\underset{O}{\overset{\|}{S}}}-C_7F_{15} \right]^{\ominus} \text{ and}$$

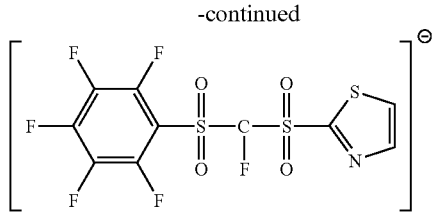

and among them,

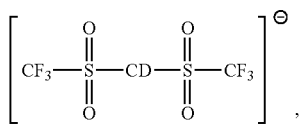

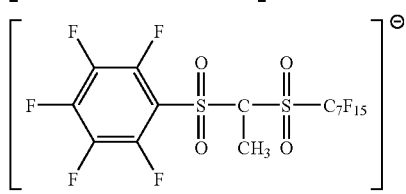

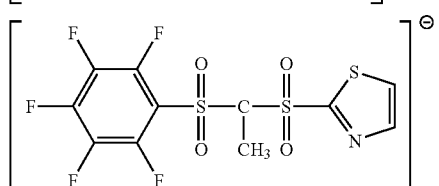

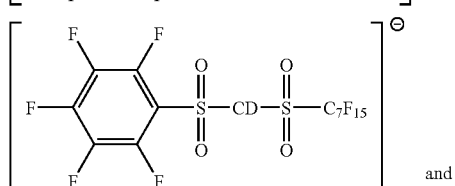

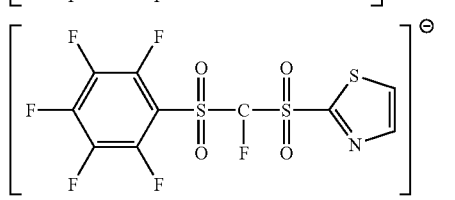

are preferred.

Examples of the ligand having the structure of the formula (b2) are those raised below.

(b2-1) Ligands having Carbonylimide Structure

Those ligands are concretely represented by the formula (b2-1):

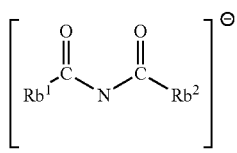

(b2-1)

wherein $Rb^1$ and $Rb^2$ are as defined in the formula (b1-1).
Those ligands are preferred because of good light emitting efficiency, good amplifying efficiency and good compatibility of the formed complex with the fluorine-containing acrylate polymer (A).

Examples thereof are:

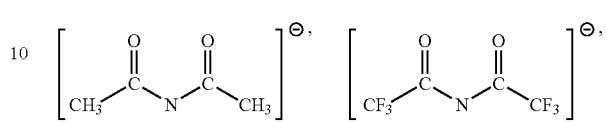

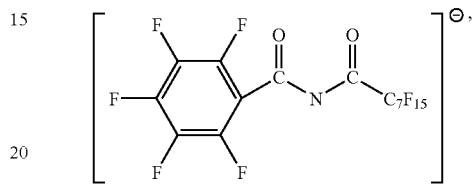

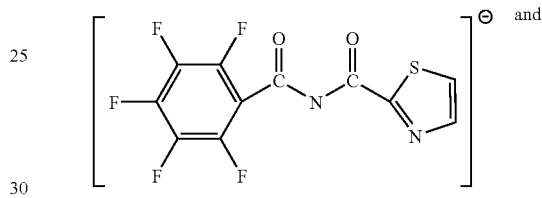

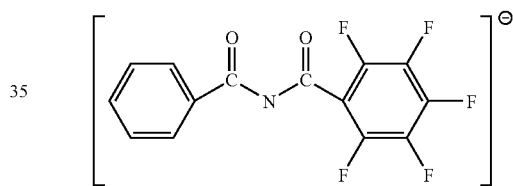

and among them,

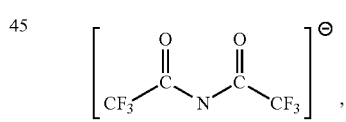

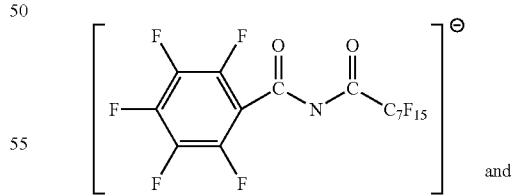

and

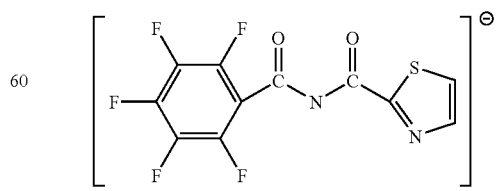

are preferred.

(b2-2) Ligands having Sulfonimide Structure

Those ligands are concretely represented by the formula (b2-2):

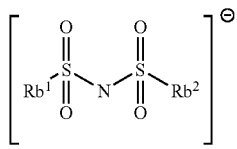

(b2-2)

wherein $Rb^1$ and $Rb^2$ are as defined in the formula (b2-1). Those ligands are preferred because of good light emitting efficiency, good amplifying efficiency and good compatibility of the formed complex with the fluorine-containing acrylate polymer (A).

Examples thereof are:

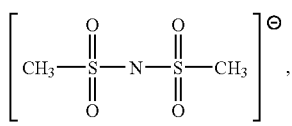

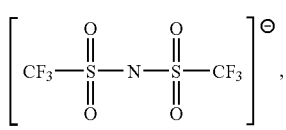

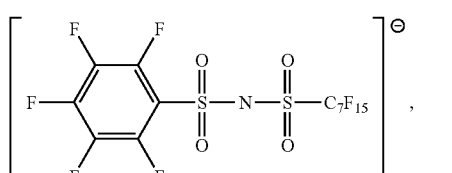

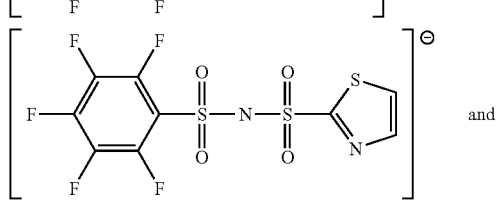

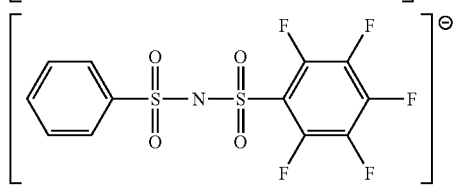

and among them,

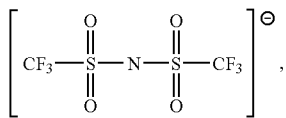

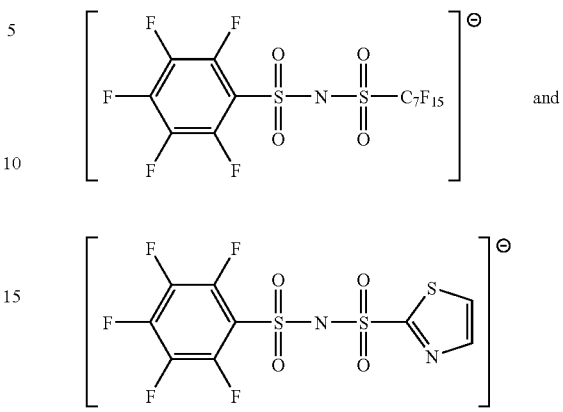

are preferred.

In the formulae (b1-1), (b1-2), (b2-1) and (b2-2), it is preferable that at least either $Rb^1$ or $Rb^2$ is a fluorine-containing hydrocarbon group having 1 to 20 carbon atoms in which a part or the whole of hydrogen atoms are replaced by fluorine atoms, from the viewpoint of a light emitting (amplifying) efficiency.

Further in the formulae (b1-1) and (b1-2), it is preferable that $X^{11}$ is heavy hydrogen atom or fluorine atom, from the viewpoint of a light emitting (amplifying) efficiency.

Examples of the ligand having the structure of the formula (b3) are those raised below.

(b3-1) Ligands Represented by the Formula (b3-1):

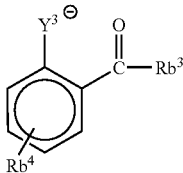

(b3-1)

wherein $Rb^3$ is at least one selected from hydrogen atom, hydrocarbon groups having 1 to 20 carbon atoms, fluorine-containing hydrocarbon groups having 1 to 20 carbon atoms in which a part or the whole of hydrogen atoms are replaced by fluorine atoms and hydrocarbon groups having 1 to 20 carbon atoms and containing a heterocyclic structure; $Rb^4$ is hydrogen atom, a hydrocarbon group which has 1 to 20 carbon atoms and may have ether bond or a fluorine-containing hydrocarbon group which may have ether bond in which a part or the whole of hydrogen atoms are replaced by fluorine atoms; $Y^3$ is as defined in the formula (b3). Those ligands are preferred because of good light emitting efficiency, good amplifying efficiency and good compatibility of the formed complex with the fluorine-containing polymer (A).

Examples thereof are:
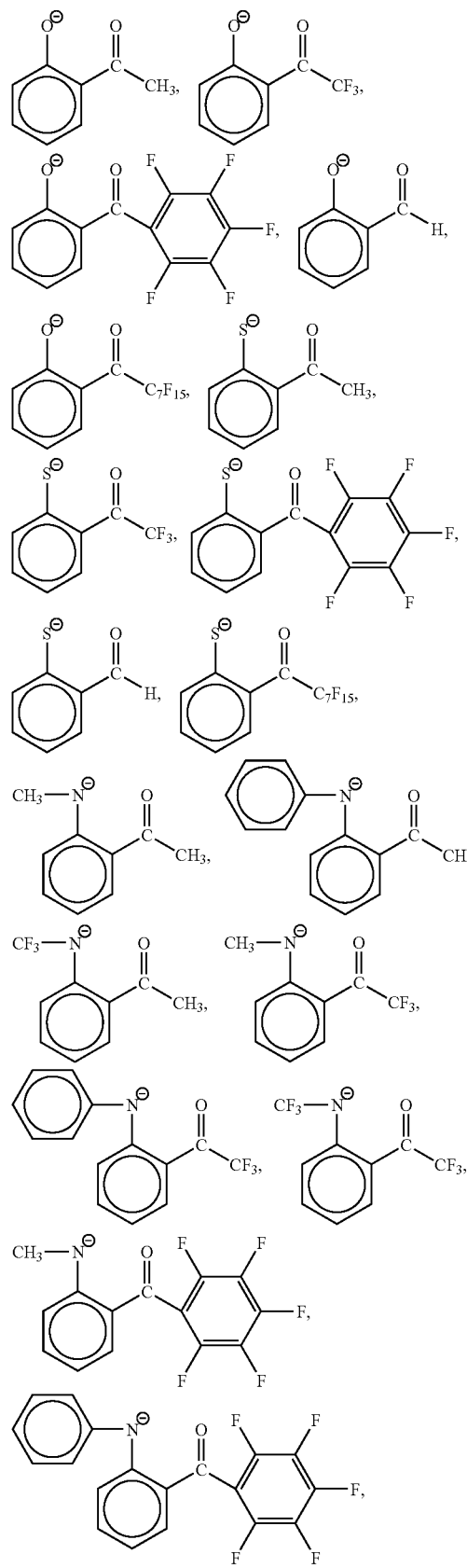
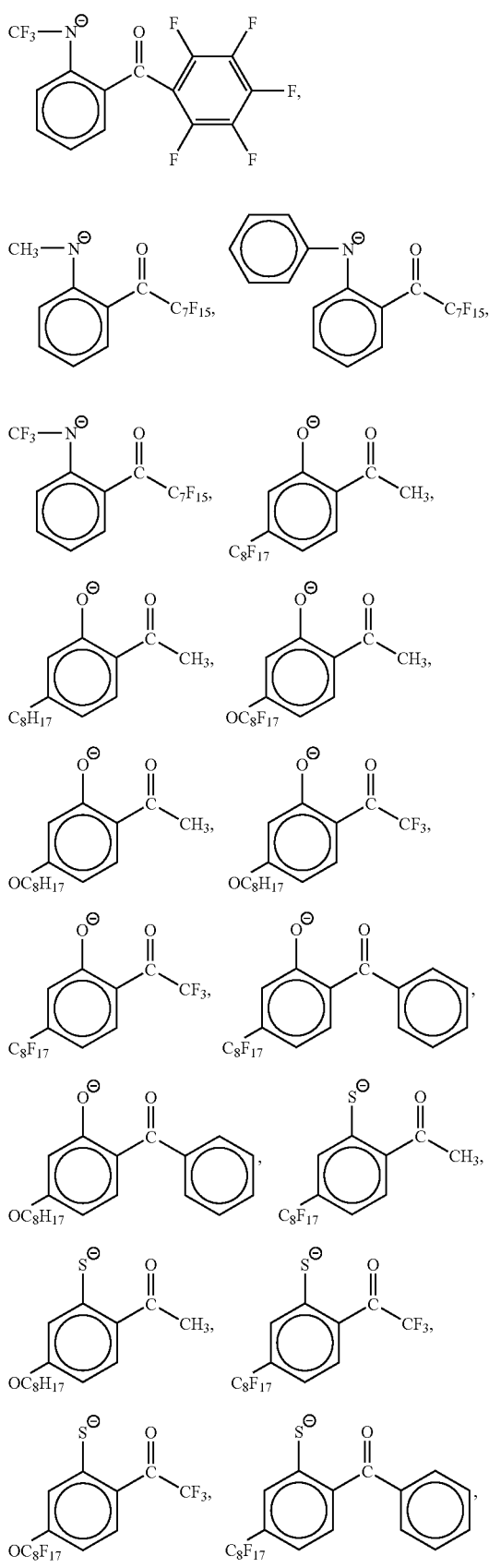

-continued
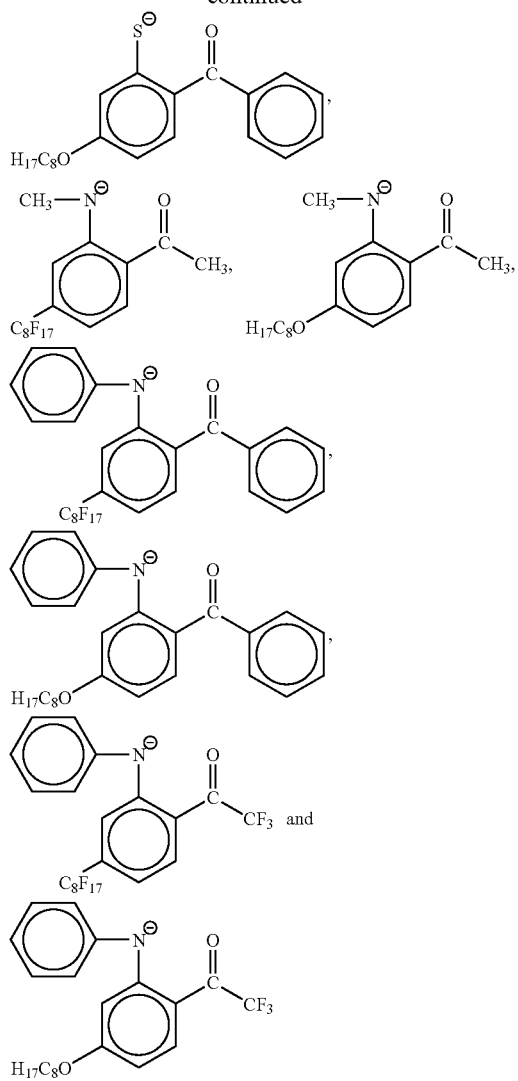
and among them,
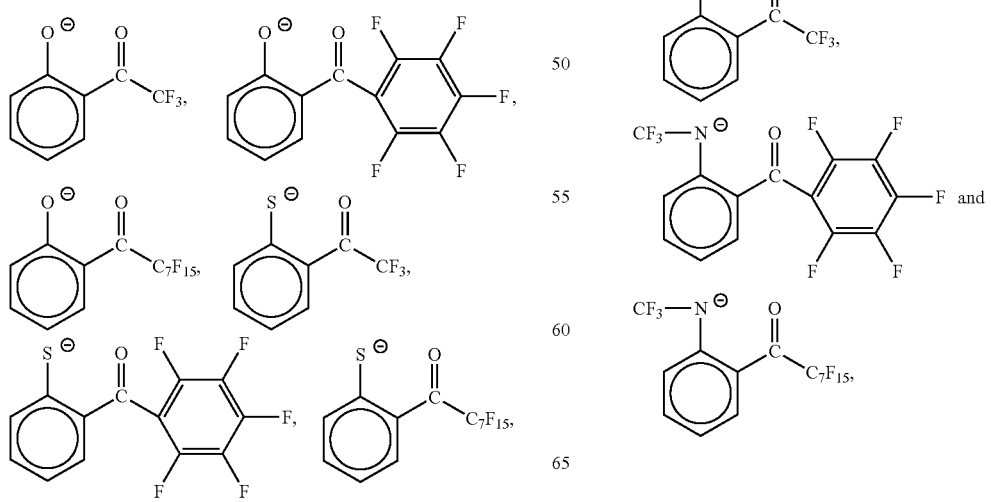
are preferred.

(b3-2) Ligands Represented by the Formula (b3-2):
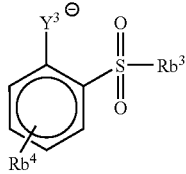
wherein $Rb^3$ and $Rb^4$ are as defined in the formula (b3-1); $Y^3$ is as defined in the formula (b3). Those ligands are preferred because of good light emitting efficiency, good amplifying efficiency and good compatibility of the formed complex with the fluorine-containing polymer (A).
Examples thereof are:
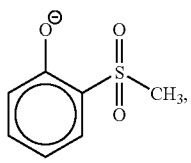
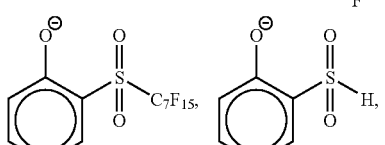
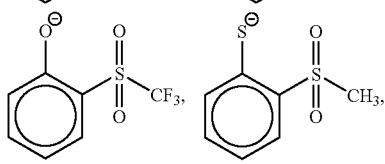
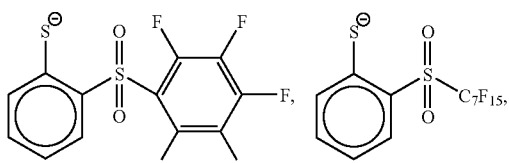
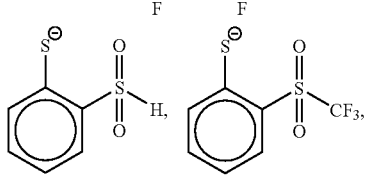
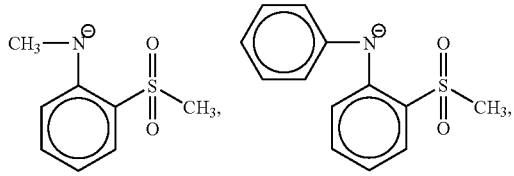
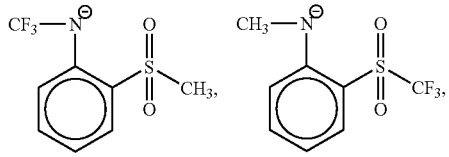
-continued
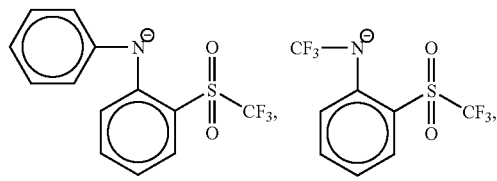
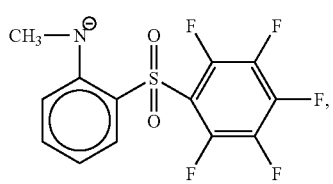
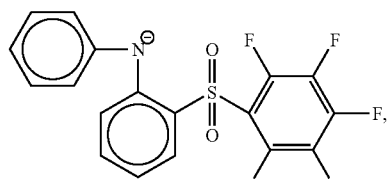
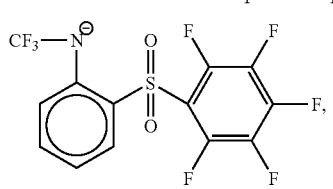
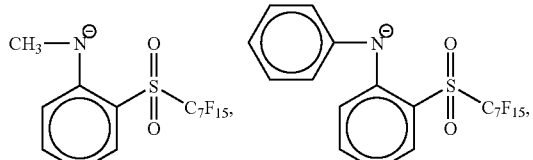
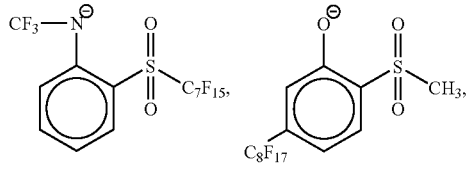
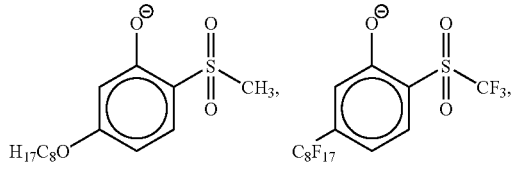
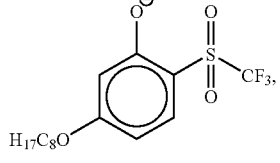
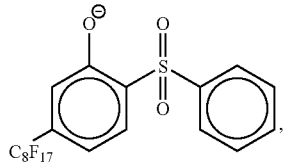

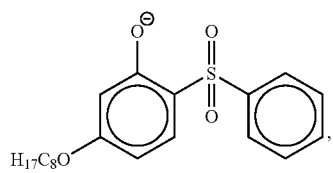,
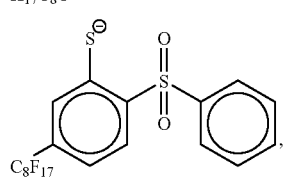,
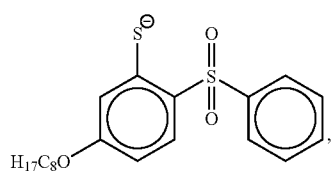,
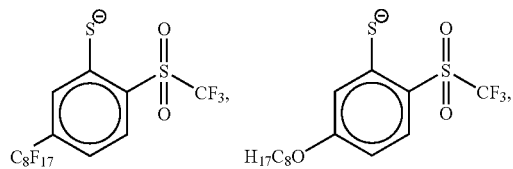,
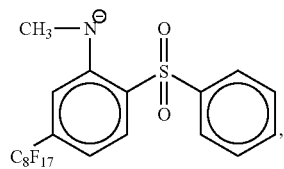,
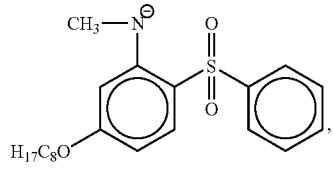,
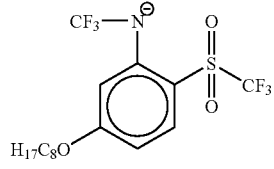 and
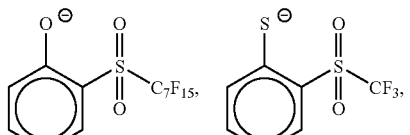,
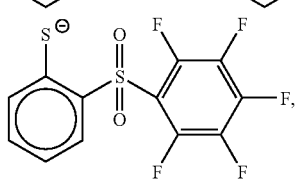,
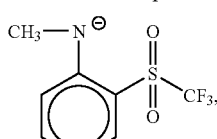,
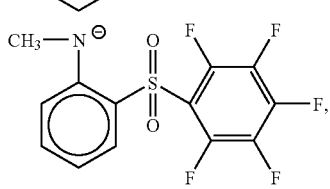,
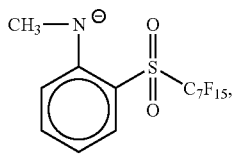,
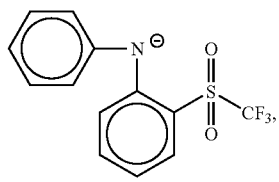,
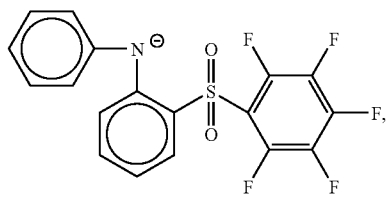,
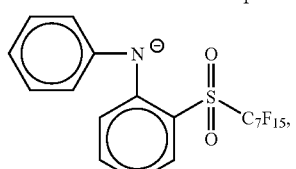,
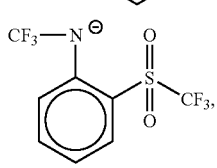,
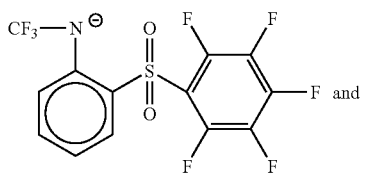 and
and among them,
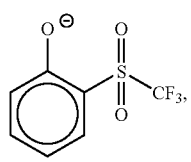, 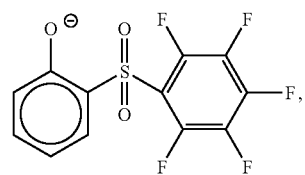,

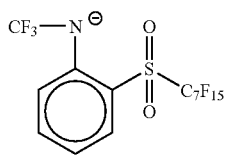

are preferred.

(b3-3) Ligands Represented by the Formula (b3-3):

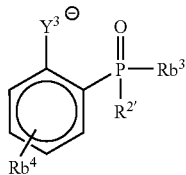

(b3-3)

wherein $Rb^3$ and $Rb^4$ are as defined in the formula (b3-1); $Y^3$ and $R^{2'}$ are as defined in the formula (b3). Those ligands are preferred because of good light emitting efficiency, good amplifying efficiency and good compatibility of the formed complex with the fluorine-containing acrylate polymer (A).

Examples thereof are:

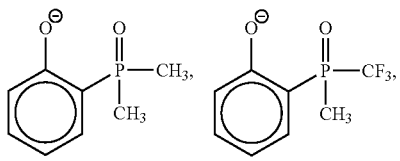

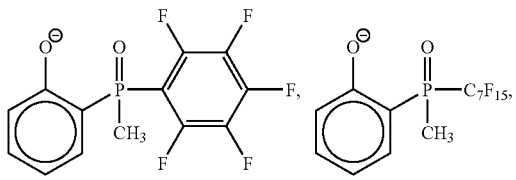

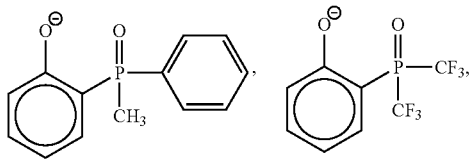

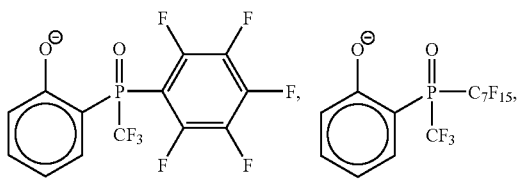

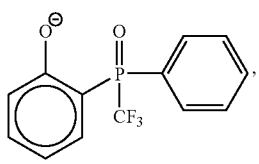

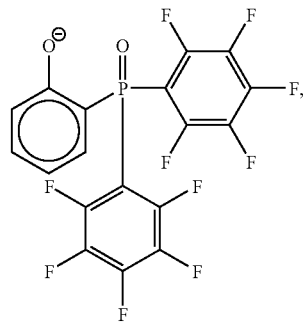

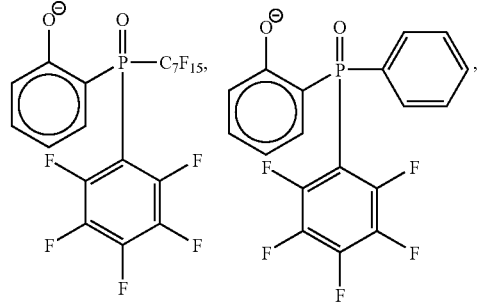

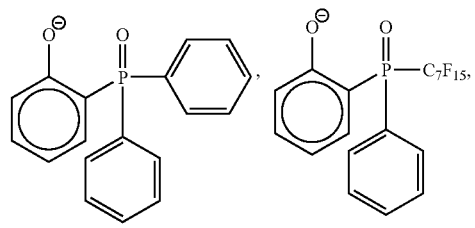

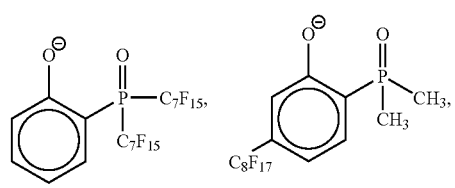

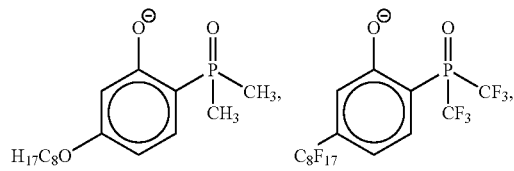

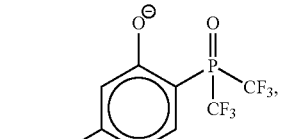

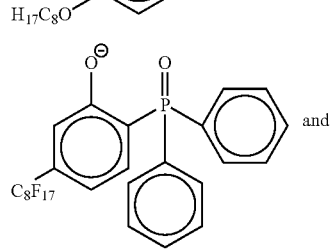

and

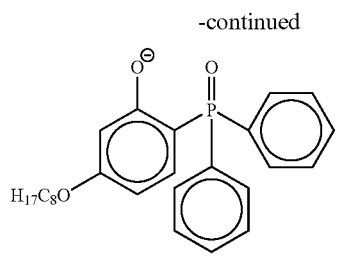

and among them,

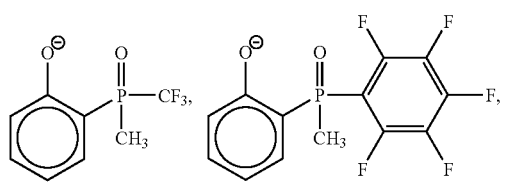

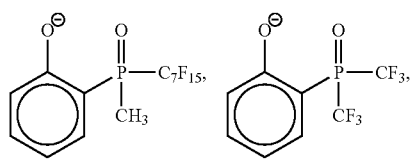

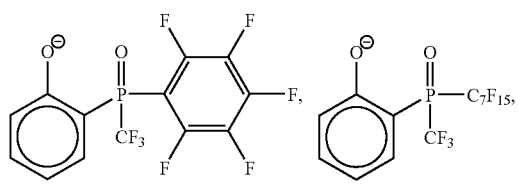

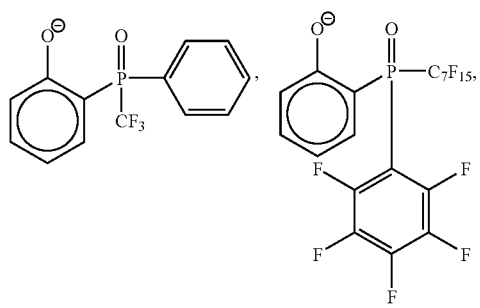

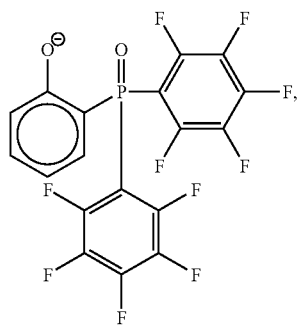

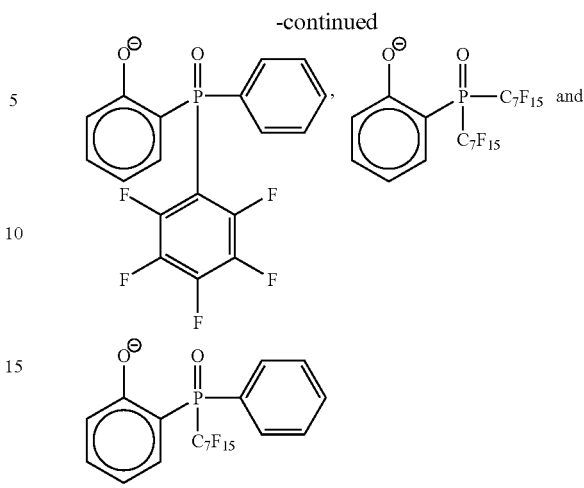

are preferred.

In the formulae (b3), (b3-1), (b3-2) and (b3-3), it is preferable that $Rb^3$ is a fluorine-containing hydrocarbon group having 1 to 20 carbon atoms in which a part or the whole of hydrogen atoms are replaced by fluorine atoms, from the viewpoint of a light emitting (amplifying) efficiency.

In the formulae (b3) and (b3-3), it is preferable that $R^{1'}$, $R^{2'}$ and $R^{3'}$ are fluorine-containing hydrocarbon groups having 1 to 20 carbon atoms in which a part or the whole of hydrogen atoms are replaced by fluorine atoms, from the viewpoint of a light emitting (amplifying) efficiency.

The rare earth metal complex to be used for the photofunctional laminated article of the present invention may be one containing ligands of electric charge non-compensation type having no electric charge (negative charge).

The ligands of electric charge non-compensation type have no electric charge in the whole ligands and have π-electron-pair being capable of coordination on a vacant d-site of rare earth metal. The ligands of this type are usually selected from compounds having a moiety of:

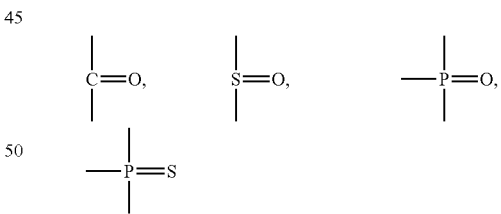

or the like.

Examples thereof are:

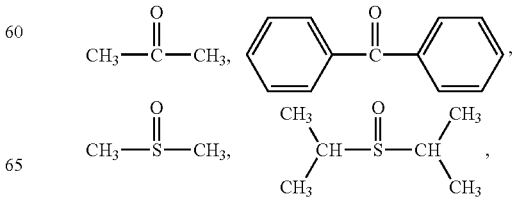

-continued
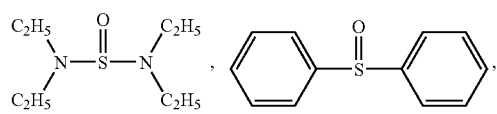
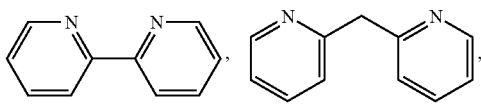
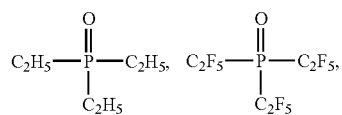
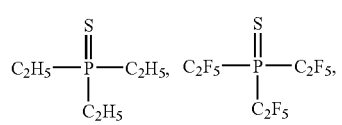
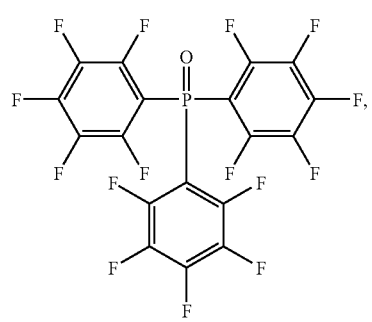
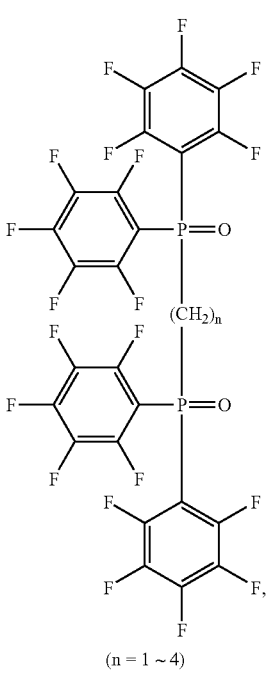
(n = 1 ~ 4)
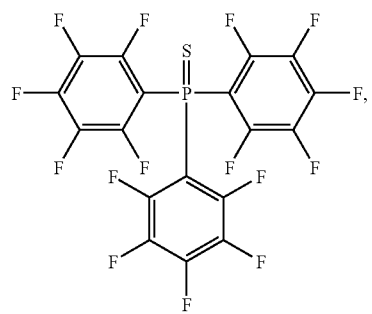
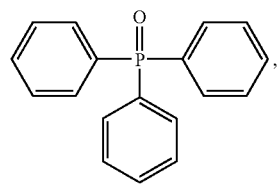
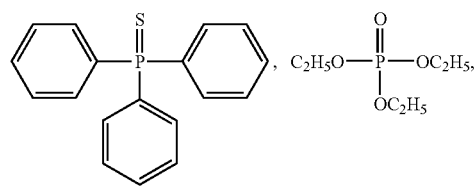
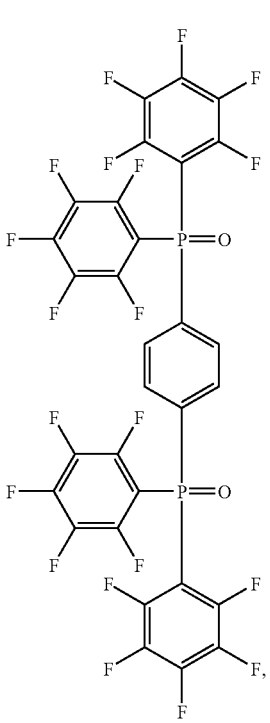

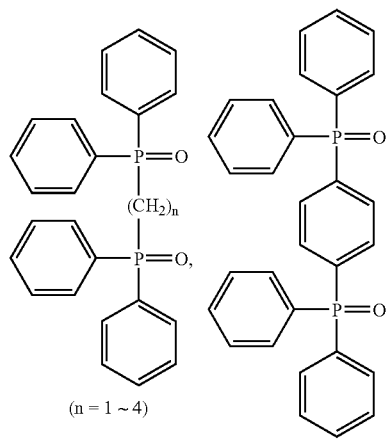
and the like, and preferred are:
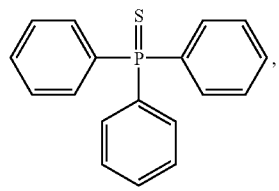
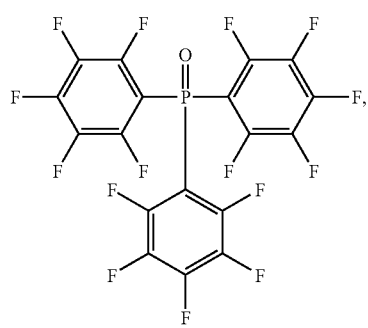
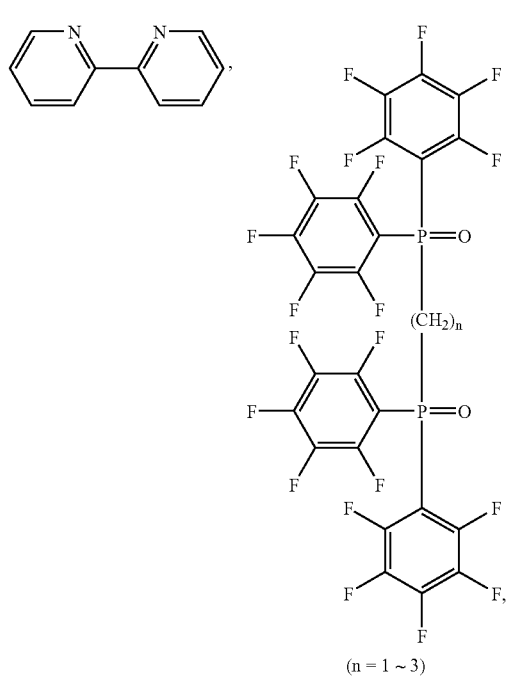
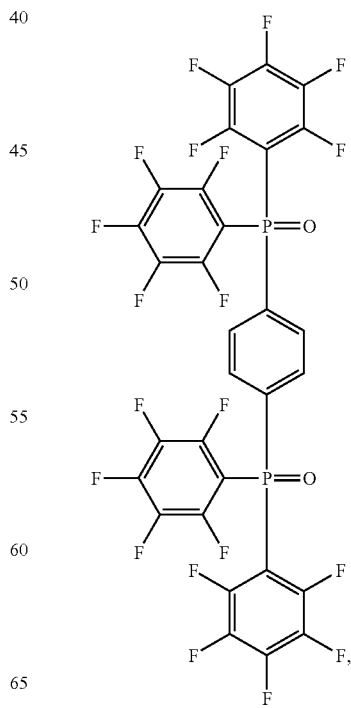

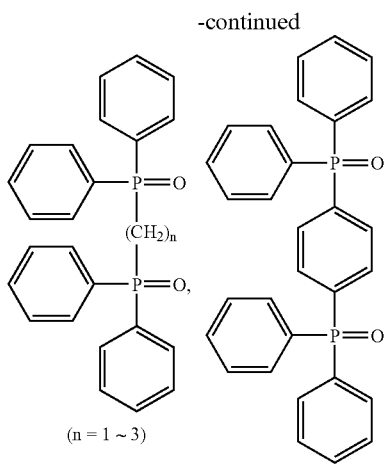

(n = 1 ~ 3)

and the like.

The ligands of electric charge non-compensation type in which fluorine atoms are partly introduced are preferred from the viewpoint of a light emitting (amplifying) efficiency.

The rare earth metal complex to be used in the present invention may be one in which at least one ligand, preferably 3 or 4 ligands selected from the above-mentioned ligands of electric charge compensation type or electric charge non-compensation type are bonded by coordination to a plus trivalent rare earth metal ion. The rare earth metal complex may contain either the electric charge compensation type ligand or the electric charge non-compensation type ligand or may contain both of the electric charge compensation type ligand and the electric charge non-compensation type ligand.

Among them, a rare earth metal complex containing at least one ligand of electric charge compensation type is preferred, and particularly preferred is a rare earth metal complex containing three ligands of electric charge compensation type bonded by coordination. Further a ligand of electric charge non-compensation type may be introduced as case demands as the fourth ligand. Those complexes containing ligand of electric charge compensation type are preferred because stability thereof is high, a light emitting (amplifying) efficiency is excellent, and dispersibility in and compatibility with the fluorine-containing polymer (A) to be used in the present invention are excellent.

As a result, in the photofunctional laminated article of the present invention, the complex functions effectively for an intensity of light emission (amplification) and a light emitting (amplifying) efficiency.

(B2) Inorganic Phosphor Activated with Rare Earth Element

In the inorganic phosphor activated with rare earth element, a rare earth metal is activated in an inorganic salt, and the inorganic phosphor activated with rare earth element is preferred because heat resistance thereof is high.

Examples of the inorganic phosphor activated with rare earth element are phosphors raised below.

(1) YAG (yellow light emitting material) (YaGdl-a)(AlbGal-b)$O_{12}CE^{3+}$ and the like
(2) YOS (red light emitting material) $Y_2O_2S$:Er and the like
(3) BAM: Eu (blue light emitting material) (Ba, Mg)$Al_{10}O_{17}$:Er and the like
(4) SCA (blue light emitting material) (Sr, CaBaMg)$_{10}$(PO$_4$)$_6$Cl$_2$:Eu and the like
(5) GN4 (green light emitting material) ZnS:Cu, Al and the like
(6) BAM: Eu, Mn (green light emitting material) (Ba, Mg)$Al_{10}O_{17}$: Eu, Mn and the like (B3) Rare earth metal ion In the rare earth metal compound (B) to be used in the present invention, a rare earth metal ion is usually mixed to a counter anion being capable of ionic bonding to the rare earth metal ion to be formed into a salt. The valence of the rare earth metal cation is not limited, and the rare earth metal cation is usually used as a salt of divalent, trivalent or tetravalent metal cation.

Examples of the rare earth metal salt are halides such as chlorides, bromides and iodides of the rare earth elements exemplified above; and salts such as nitrates, perchlorates, bromates, acetates, sulfates and phosphates. Also the rare earth metal salt may be organic salts of rare earth metals such as salts of organic acids and salts of organic sulfonic acids. Double salt of nitrates, double salt of sulfates and chelated compounds can also be used.

Examples of the rare earth metal salts are praseodymium salts such as praseodymium chloride, praseodymium bromide, praseodymium iodide, praseodymium nitrate, praseodymium perchlorate, praseodymium bromate, praseodymium acetate, praseodymium sulfate and praseodymium phosphate; neodymium salts such as neodymium chloride, neodymium bromide, neodymium iodide, neodymium nitrate, neodymium perchlorate, neodymium bromate, neodymium acetate, neodymium sulfate and neodymium phosphate; europium salts such as europium chloride, europium bromide, europium iodide, europium nitrate, europium perchlorate, europium bromate, europium acetate, europium sulfate and europium phosphate; erbium salts such as erbium chloride, erbium bromide, erbium iodide, erbium nitrate, erbium perchlorate, erbium bromate, erbium acetate, erbium sulfate and erbium phosphate; terbium salts such as terbium chloride, terbium bromide, terbium iodide, terbium nitrate, terbium perchlorate, terbium bromate, terbium acetate, terbium sulfate and terbium phosphate; samarium salts such as samarium chloride, samarium bromide, samarium iodide, samarium nitrate, samarium perchlorate, samarium bromate, samarium acetate, samarium sulfate and samarium phosphate; and the like.

In the photofunctional layer (L1) of the present invention, the proportions of the fluorine-containing polymer (A) and the rare earth metal compound (B) are from 1 to 99.99% by mass and 0.01 to 99% by mass (% by mass of ion, hereinafter the same with respect to the content of the rare earth metal compound (B)), respectively. The proportions are optionally selected depending on kind, application and purpose of the rare earth metal compound (B) and the fluorine-containing polymer (A) to be used.

In applications for optical communication parts such as light amplifying device and optical waveguide and for light emitter, it is preferable to select the content of rare earth metal compound within a range of from 0.01 to 20% by mass, more preferably from 0.1 to 15% by mass, most preferably from 0.5 to 10% by mass from the viewpoint of enhancement of fluorescence intensity.

If the content of rare earth metal compound (B) is too small, desired properties such as an intended light amplifying action, intensity of light emission and wavelength conversion effect are not exhibited.

On the other hand, if the content of rare earth metal compound (B) is too large, dispersibility and compatibility of the rare earth metal compound (B) and the fluorine-containing polymer (A) forming a matrix polymer are lowered, and therefore a too large content is not preferred.

The content of rare earth metal ion can be determined by burning the organic component in an electric oven of about 600° C. and measuring an ash content thereof or can be determined quantitatively by physico-chemical means such as fluorescent X-ray spectroscopy.

To the photofunctional layer (L1) of the present invention may be added various additives as case demands in addition to the above-mentioned fluorine-containing polymer (A) and rare earth metal compound (B). Examples of the additives are, for instance, a leveling agent, viscosity regulating agent, light-stabilizer, antioxidant, moisture absorbing agent, pigment, dye, reinforcing agent and the like.

In the photofunctional laminated article of the present invention, the low refractive index layer (L2) is a transparent layer which is usually brought into contact directly on the photofunctional layer (L1) and has a refractive index lower than that of the photofunctional layer (L1).

A preferred difference in a refractive index ($n_{L1} - n_{L2}$) between the photofunctional layer (L1) and the low refractive index layer (L2) varies depending on kind of light. Specifically, a difference in a refractive index at a wavelength of light (wavelength of excitation light) to be fed to the photofunctional layer (L1) and/or a wavelength of light (fluorescence wavelength) emitted by the photofunctional layer (L1) is not less than 0.005, more preferably not less than 0.05, particularly preferably not less than 0.1.

A preferred refractive index of the low refractive index layer (L2) is from 1.30 to 1.45, more preferably from 1.30 to 1.40, particularly preferably from 1.30 to 1.38 at a wavelength of light mentioned above.

Further the low refractive index layer (L2) having high transparency to kind of the light to be intended is preferred. Specifically it is preferable that the low refractive index layer (L2) is transparent at least at a wavelength of the light to be fed to the photofunctional layer (L1). An absorption coefficient at the above-mentioned wavelength of light is not more than $1.0 \times 10^{-5}$ μm, preferably not more than $5.0 \times 10^{-6}$ μm, particularly preferably not more than $2.0 \times 10^{-6}$ μm.

Therefore it is preferable that the low refractive index layer (L2) is produced from a non-crystalline fluorine-containing polymer.

Examples of the fluorine-containing polymer to be used on the low refractive index layer (L2) are as follows.

(1) Fluorine-containing Acrylate Polymer

This polymer has a structural unit derived from a fluorine-containing acrylate having fluorine atom at least either in its portion being capable of forming a polymer side chain or in its portion being capable of forming a polymer trunk chain.

Particularly a polymer having a high fluorine content is preferred, and from this point of view, preferred are polymers having a structural unit derived from a fluorine-containing acrylate having fluorine atom in its portion being capable of forming a polymer side chain.

It is preferable that the glass transition temperature of the fluorine-containing acrylate polymer is higher because a mechanical strength and surface hardness can be improved. The glass transition temperature is not less than 40° C., preferably not less than 60° C., more preferably not less than 80° C., particularly preferably not less than 100° C.

In the low refractive index layer (L2), those selected from the fluorine-containing acrylates used in the photofunctional layer (L1) can be preferably used similarly as the fluorine-containing acrylate constituting the fluorine-containing acrylate polymer.

Particularly preferred are those selected from the fluorine-containing acrylate polymers represented by (A1-I), (A1-II) and (A1-III).

(2) Non-crystalline Fluorine-containing Polymer having Curable Site or Cured Article thereof There are a fluorine-containing polymer having curable (crosslinkable) functional group at an end of the polymer side chain or at an end of the polymer trunk chain, and a cured article obtained by self-curing (crosslinking) the polymer or by curing (crosslinking) the polymer in the presence of a curing agent (a crosslinking agent).

Preferred examples thereof are fluorine-containing polymers having a structural unit derived from a fluorine-containing ethylenic monomer having curable (crosslinkable) functional group at an end of its side chain, for example, fluorine-containing prepolymers having carbon-carbon double bond and cured articles obtained by curing those prepolymers which are disclosed in WO02/18457 and WO02/073255, fluorine-containing polymers having crosslinkable cyclic ether structure and cured articles obtained by curing those polymers which are disclosed in WO2004/016689, and the like. At least one fluorine-containing polymer is selected therefrom.

The layer obtained from those fluorine-containing polymers having curable site is preferred because curing can be carried out easily by application of light or heat and a mechanical strength and hardness can be improved significantly, and as a result, a flaw and abrasion are difficult to be caused when the layer is used as an outermost layer.

(3) Fluorine-containing Polymer having Aliphatic Ring Structure in its Trunk Chain Specifically preferred are fluorine-containing polymers having a structural unit of fluorine-containing aliphatic ring structure. Preferred examples of the fluorine-containing aliphatic ring structural unit are, for instance, those represented by the formula (5):

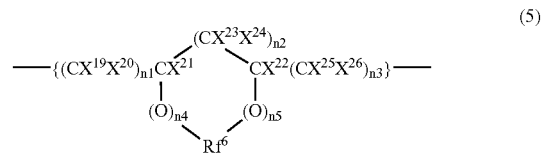

wherein $X^{19}$, $X^{20}$, $X^{23}$, $X^{24}$, $X^{25}$ and $X^{26}$ are the same or different and each is H or F; $X^{21}$ and $X^{22}$ are the same or different and each is H, F, Cl or $CF_3$; $Rf^6$ is a fluorine-containing alkylene group having 1 to 10 carbon atoms or a fluorine-containing alkylene group having 2 to 10 carbon atoms and ether bond; n2 is 0 or an integer of 1 to 3; n1, n3, n4 and n5 are the same or different and each is 0 or 1.

For example, there are polymers having a structural unit represented by:

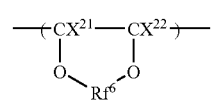

wherein $Rf^6$, $X^{21}$ and $X^{22}$ are as defined above.

Concretely there are polymers having a structural unit represented by:

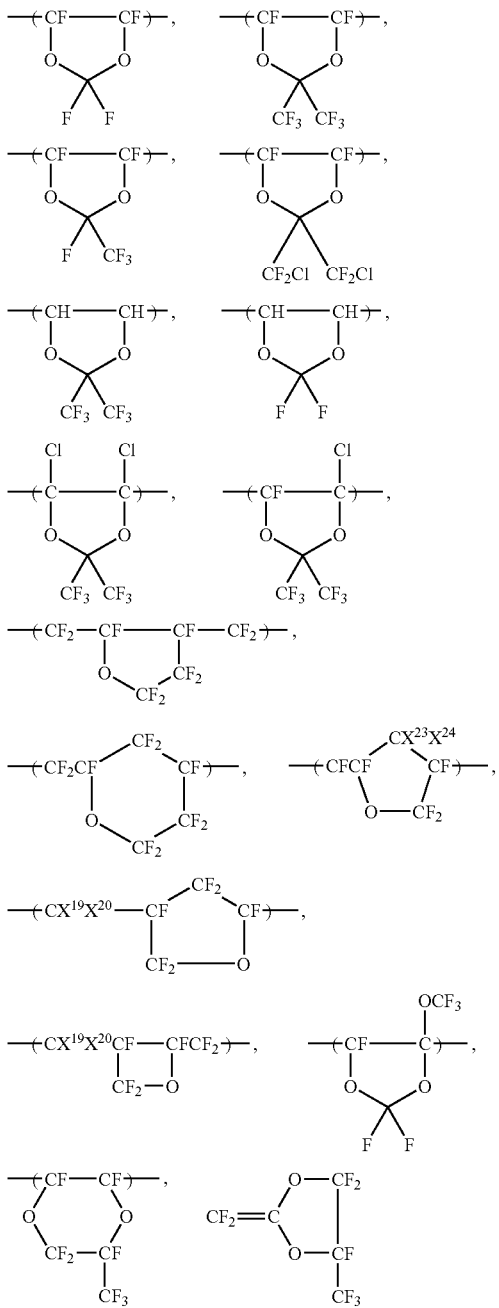

or the like, wherein $X^{19}$, $X^{20}$, $X^{23}$ and $X^{24}$ are as defined above.

Those fluorine-containing polymers are preferred because transparency is high in a wide wavelength range of from vacuum ultraviolet region to near infrared region and the glass transition temperature is high.

Particularly preferred are cyclic ether copolymers obtained from an ethylenic unsaturated monomer and a compound having 1,3-dioxole ring structure which is represented by the formula (6):

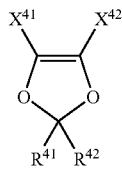

(6)

wherein $R^{41}$ and $R^{42}$ are the same or different and each is F, H, Cl or a perfluoroalkyl group having 1 to 5 carbon atoms; $X^{41}$ and $X^{42}$ are the same or different and each is F, H, Cl or —$OR^{43}$ ($R^{43}$ is a perfluoroalkyl group having 1 to 5 carbon atoms), provided that at least either $R^{41}$ or $R^{42}$ is F or a perfluoroalkyl group having 1 to 5 carbon atoms.

Specifically, preferred as the compound of the formula (6) having 1,3-dioxole ring structure is perfluoro-(2,2-dimethyl-1,3-dioxole) (PDD), in which $X^{41}$ and $X^{42}$ are fluorine atoms or $R^{41}$ and $R^{42}$ are $CF_3$. Further it is preferable, from the viewpoint of transparency and a low refractive index, that the structural unit of ethylenic unsaturated monomer in the cyclic ether copolymer is a structural unit derived from a monomer selected from fluorine-containing ethylenic unsaturated monomers, particularly tetrafluoroethylene or chlorotrifluoroethylene.

Further particularly preferred is the cyclic ether copolymer having a glass transition temperature of from 100° to 135° C. and an intrinsic viscosity of from 0.01 to 0.4 dl/g at 35° C. in perfluoro-2-butyltetrahydrofuran because film forming property is excellent when forming the low refractive index layer (L2).

Other preferred examples are copolymers having a structural unit of norbornene derivative, for example, copolymers of fluorine-containing olefin such as tetrafluoroethylene or chlorotrifluoroethylene and a norbornene derivative, copolymers of fluorine-containing acryl and a norbornene derivative, and the like.

In the photofunctional laminated article of the present invention, the transparent substrate (L0) works as a supporting substrate when the intended light (fluorescence) generated in the photofunctional layer (L1) passes through the substrate and an object is irradiated with the light. A material and shape of the substrate are optionally selected depending on purpose, application and conditions.

The transparent substrate (L0) has a refractive index which is the same as or larger than a refractive index of the photofunctional layer (L1) to be provided thereon, and as a result, the light (fluorescence) generated in the photofunctional layer (L1) passes through the transparent substrate (L0) more preferentially and an object is irradiated efficiently on a target.

The substrate is selected from transparent inorganic substrates and transparent organic substrates, particularly transparent resin substrates.

Preferred examples of the transparent inorganic substrate are glass substrates such as soda-lime glass, soda-potassium lead glass, hard glass (primary and secondary), tungsten glass and quartz (including those doped with various metals) and crystals of calcium fluoride, magnesium fluoride and the like. Particularly preferred are glass substrates.

The organic transparent substrate is usually selected from transparent resins. Examples thereof are acrylic resins, polycarbonate resins, transparent polyester resins, transparent polyethylene resins, transparent propylene resins, transparent ABS resins, methyl cellulose resins, transparent polystyrenes, transparent epoxy resins, polyarylates, polysulfones, polyether sulfones, transparent nylon resins, transparent polybutylene terephthalates, transparent polyethylene terephthalates, transparent fluorine-containing resins, TPX (poly-4-methylpentene-1), transparent phenoxy resins, polyimide resins, cycloolefin resins (norbornene resins and the like), silicone elastomers, thermoplastic polystyrene elastomers, thermoplastic polyolefin elastomers, thermoplastic polyurethane elastomers, organic non-linear optical materials and the like.

Particularly preferred are acrylic resins, polycarbonate resins, transparent polyethylene terephthalates, methyl cellulose resins, cycloolefin resins and the like because those resins are excellent in transparency and useful for optical application and also have good mechanical properties and flexibility even when used in the form of film.

The shape of the transparent substrate (L0) of the present invention is not limited particularly and is optionally selected depending on purpose and application, concretely depending on a structure of an object irradiated with the light (fluorescence) generated in the photofunctional layer (L1) and construction and structure of a device including the laminated article. There are employed substrates in the form of plate, sheet, film, fiber, rod, cube and particle and further previously molded substrates.

Particularly preferred are transparent resin substrates in the form of film since processability in producing the laminated article of the present invention is excellent and further the substrate can be easily applied to various objects by post-processing.

The thickness of the transparent resin substrate in the form of film varies depending on the material of the film, and is usually from 0.5 to 5,000 μm, preferably from 1 to 1,000 μm, more preferably from 5 to 500 μm, particularly preferably from 10 to 300 μm.

In the photofunctional laminated article of the present invention, the thickness of the photofunctional layer (L1) varies depending on an intensity of light (fluorescence) emission, application and purpose of the photofunctional layer (L1) and is optionally selected. The thickness is usually from about 1 nm to about 1 mm, preferably from 0.05 to 5,000 μm, more preferably from 0.1 to 1,000 μm, particularly preferably from 0.5 to 500 μm, further preferably from 1 to 100 μm.

The first preferred thickness of the low refractive index layer (L2) is a thickness intended to obtain a reflection reducing effect against the light (excitation light) to be fed to the photofunctional layer (L1). Usually it is preferable that the thickness $d_{L2}$ is adjusted to a thickness calculated by the equation:

$$d_{L2} = x \cdot \lambda / 4 n_{L2}$$

wherein $d_{L2}$ is the thickness (nm) of the low refractive index layer; x is an odd number; λ is a wavelength (nm) of excitation light; $n_{L2}$ is a refractive index of the low refractive index layer measured at the wavelength (λ).

The secondly preferred thickness of the low refractive index layer (L2) is a thickness intended to direct the light (fluorescence) generated in the photofunctional layer (L1) by feeding the excitation light more preferentially to an intended direction, for example, to a direction of the transparent substrate (L0). The thickness is usually from $1.0 \times 10^{-1}$ to $1.0 \times 10^{4}$ μm, preferably from $1.0 \times 10^{-1}$ to $5.0 \times 10^{3}$ μm, more preferably from $1.0 \times 10^{-1}$ to $1.0 \times 10^{3}$ μm, particularly preferably from $1.0 \times 10^{-1}$ to $5 \times 10^{2}$ μm, further preferably from $1.0 \times 10^{-1}$ to $1.0 \times 10^{2}$ μm.

In the method of producing the laminated article of the present invention, the photofunctional layer (L1) is formed on the transparent substrate (L0) by applying the coating composition containing the fluorine-containing polymer (A) and the rare earth metal compound (B) on the transparent substrate and then forming a film by drying or the like and further as case demands, carrying out a curing reaction by irradiation of heat or light, and then the low refractive index layer (L2) is formed similarly by a coating method by using a coating composition containing a fluorine-containing polymer having a low refractive index.

For the coating of each of the photofunctional layer (L1) and the low refractive index layer (L2), known coating methods can be used, for example, rotary coating (spin coating), cast coating, roll coating, gravure coating and the like.

Also the respective single-layer films of the photofunctional layer (L1) and the low refractive index layer (L2) obtained by melt extrusion molding may be laminated on the transparent substrate (L0) by thermocompression bonding or the like.

Further a laminated film of the photofunctional layer (L1) and the low refractive index layer (L2) and also a three-layered laminated film further having a transparent resin film may be molded at the same time by a co-extrusion method.

In the photofunctional laminated article of the present invention, preferred examples of the combination of the photofunctional layer (L1) and the low refractive index layer (L2) are as follows.

(I) Laminated Article in which the Fluorine-containing Polymer (A) of the Photofunctional Layer (L1) and the Polymer of the Low Refractive Index Layer (L2) are the same:

This combination is preferred because in the production of a laminated article by the mentioned co-extrusion method, the laminated article can be produced more efficiently.

(II) Laminated Article in which the Fluorine-containing Polymer (A) of the Photofunctional Layer (L1) is a Cured Article by Curing the Polymer having Curable Site:

This is preferred because when forming the low refractive index layer (L2) by the coating method, intermixing is difficult to occur at an interface between the photofunctional layer (L1) and the low refractive index layer (L2).

(III) Laminated Article in which Both of the Fluorine-containing Polymer (A) of the Photofunctional Layer (L1) and the Polymer of the Low Refractive Index Layer (L2) are Cured Articles by Curing Polymers having Curable Site:

This is preferred because an efficiency of light emission (fluorescence) and mechanical properties of its surface are good.

In the photofunctional laminated article of the present invention, the light (excitation light) fed from the side of the low refractive index layer (L2) can be transmitted efficiently to the photofunctional layer (L1) and high intensity light can be generated in the photofunctional layer (L1) at a good efficiency of light (fluorescence) emission.

Further the light generated in the photofunctional layer (L1) can be efficiently fed to an intended direction, namely to the direction of the transparent substrate (L0).

Accordingly the laminated article can be used for various applications in an optical system.

For example, there are the following applications.

(i) Wavelength Conversion Application

A wavelength conversion laminated article, for example, a wavelength conversion film in which by applying an incident light such as a sun light through the low refractive index layer (L2), a specific wavelength (band) of the sun light is converted to an intended other wavelength (band) and the transparent substrate (L0) is irradiated selectively with light of the converted wavelength.

For example, when the wavelength conversion film is provided on the surface of a solar cell element with the low refractive index layer (L2) being faced to the sun light, a specific wavelength of sun light can be efficiently converted to a characteristic wavelength of a solar cell element which is high in light-electricity conversion efficiency, resulting in making it possible to conduct amplification and enhance energy conversion efficiency.

(ii) Application for Color Correction of Image

Application for imparting natural color tone to an image by providing the laminated article of the present invention on a lens of a projector or the like and increasing a tinge of red (an europium compound is used for the photofunctional layer) or the like.

For example, when the laminated article of the present invention is provided on the lens with the low refractive index layer (L2) being faced to the light source, color correction of an image can be carried out more efficiently.

(iii) Color Rendering Application in LED, etc.

When the laminated article of the present invention is provided on a light emitting diode comprising LED, it becomes possible to change a luminescence of the LED to a desired color by utilizing a part of light of the LED as an excitation light.

When the laminated article of the present invention is provided on the LED with the low refractive index layer (L2) being faced to the light source, a stable balanced color tone can be efficiently obtained by a sole LED.

Further white luminescence can be obtained efficiently by controlling the rare earth metal compound in the photofunctional layer (L1) and fitting the laminated article of the present invention on a blue light emitting diode in the same manner as above.

EXAMPLE

The present invention is then explained by means of examples, but is not limited to them.

The methods of measuring various physical properties and parameters which are used in the present invention are explained as follows.

(1) NMR

NMR measuring equipment: available from BRUKER CO., LTD. Measuring conditions of $^1$H-NMR: 300 MHz (tetramethylsilane=0 ppm) Measuring conditions of $^{19}$F-NMR: 282 MHz (trichlorofluoromethane=0 ppm)

(2) IR Analysis: Measuring is carried out at room temperature with a fourier-transform infrared spectrophotometer 1760X available from perkin elmer Co., Ltd.

(3) Glass Transition Temperature Tg

Elevation of temperature (first run), lowering of temperature and elevation of temperature (second run) are carried out at a temperature elevating or lowering rate of 10° C./min within a range of from 30° C. to 200° C. by using DSC (differential scanning calorimeter: RTG220 available from SEIKO), and an intermediate point of a heat absorption curve of the second run is assumed to be Tg (° C.).

(4) Fluorine Content

The fluorine content (% by mass) is obtained by burning 10 mg of a sample by an oxygen flask combustion method, absorbing cracked gas in 20 ml of de-ionized water and then measuring a fluorine ion concentration in the fluorine ion-containing solution through a fluoride-ion selective electrode method (using a fluorine ion meter model 901 available from Orion).

(5) Measurement of Transmissivity

Transmissivity of each sample is measured with a spectrophotometer (Spectrophotometer U-4100 available from Hitachi, Ltd.).

(6) Measurement of Refractive Index

A refractive index is measured at 25° C. with an Abbe's refractometer using light of 550 nm wavelength.

(7) Measurement of Intensity of Light Emission

A light emission spectrum of each sample is measured by using a fluorescence spectrophotometer (Fluorescence spectrophotometer F-4010 available from Hitachi, Ltd.), and a peak area at a specific wavelength is compared to determine a relative intensity of light emission.

Preparation Example 1

Preparation of Eu(CF3COCHCOCF3)$_3$

Into a 100 ml glass flask were poured 2.0 g (5 mmol) of europium acetate, tetrahydrate, 3.0 g (20 mmol) of hexafluoroacetylacetone and 50 ml of pure water, followed by stirring at 25° C. for three days.

Next, the precipitated solid was taken out by filtration, and after washing with water, was subjected to re-crystallization with a water/methanol solvent mixture, and a white crystal was obtained (yield: 60%).

This crystal was subjected to IR, $^1$H-NMR and $^{19}$F-NMR analyses and was confirmed to be an intended complex, i.e. Eu(CF$_3$COCHCOCF$_3$)$_3$.

Also by Tg-DTA measurement, the obtained white crystal was presumed to be a dihydrate.

Preparation Example 2

Preparation of PMMA

Into a 50 ml three-necked glass flask were poured 10 g of methyl methacrylate and 50 mg of azobisisobutyronitrile (AIBN) as a radical polymerization initiator, followed by stirring, and a homogeneous solution was obtained. Then while replacing the inside of the flask by nitrogen, bulk polymerization was carried out by heating and stirring at 60° C. for ten hours, and a transparent solid was obtained.

Then the obtained solid was dissolved in 50 ml of acetone and the obtained solution was added dropwise to hexane for re-precipitation. The precipitated product was subjected to vacuum drying at 60° C. for five hours, and 8.0 g of a colorless transparent solid was obtained. As a result of $^1$H-NMR and IR analyses, the obtained polymer was polymethyl methacrylate (PMMA).

Preparation Example 3

Synthesis of Fluorine-containing Acrylate Polymer

A fluorine-containing acrylate polymer was synthesized in the same manner as in Preparation Example 2 except that 10 g of fluorine-containing acrylate (8FFA) represented by the following formula (a-1):

$$CH_2=CFCOOCH_2(CF_2CF_2)_{\overline{2}}H \quad (a\text{-}1)$$

was used instead of methyl methacrylate, followed by separation and refining, and 7.5 g of a colorless transparent solid was obtained.

The obtained polymer was subjected to $^1$H-NMR, $^{19}$F-NMR and IR analyses and was confirmed to be a homopolymer of 8FFA represented by the above-mentioned formula (a-1).

The fluorine content of the polymer measured by the mentioned oxygen flask combustion method was 56% by mass.

Also the glass transition temperature measured by DSC was 65° C.

Preparation Example 4

Synthesis of Fluorine-containing Acrylate Polymer

A fluorine-containing acrylate polymer was synthesized in the same manner as in Preparation Example 2 except that 10 g of 2,2,2-trifluoroethyl-αfluoro acrylate (3FFA) represented by the following formula (a-2):

$$CH_2=CFCOOCH_2CF_3 \quad (a\text{-}2)$$

was used instead of methyl methacrylate, followed by separation and refining, and 7.8 g of a colorless transparent solid was obtained.

The obtained polymer was subjected to $^1$H-NMR, $1^9$F-NMR and IR analyses and was confirmed to be a homopolymer of 3FFA represented by the above-mentioned formula (a-2).

The fluorine content of the polymer measured by the mentioned oxygen flask combustion method was 44% by mass.

Also the glass transition temperature measured by DSC was 125° C.

Preparation Example 5

Synthesis of Fluorine-containing Alkyl Ether Homopolymer having OH Group

Into a 100 ml four-necked glass flask equipped with a stirrer and thermometer were poured 20.4 g of perfluoro-(1,1,9,9-tetrahydro-2,5-bistrifluoromethyl-3,6-dioxanonenol) of the formula (a-3):

$$CH_2=CFCF_2OCFCF_2OCFCH_2OH \quad (a\text{-}3)$$
$$\phantom{CH_2=CFCF_2O}\vert\phantom{CF_2O}\vert$$
$$\phantom{CH_2=CFCF_2OC}CF_3\phantom{CF_2O}CF_3$$

and 21.2 g of a 8.0% by mass perfluorohexane solution of fluorine-containing peroxide represented by:

$$[H{-}(CF_2CF_2)_3COO]_{\overline{2}}$$

and after the inside of the flask was sufficiently replaced with nitrogen gas, stirring was carried out at 20° C. for 24 hours in nitrogen gas stream and a solid having a high viscosity was produced.

The obtained solid was dissolved in diethyl ether and poured into perfluorohexane, followed by separating and vacuum drying to obtain 17.6 g of a colorless transparent polymer.

According to IR, $^1$H-NMR and $^{19}$F-NMR analyses, the solid was a fluorine-containing polymer of only the structural unit of the above-mentioned fluorine-containing allyl ether having OH group at an end of its side chain.

Preparation Example 6

Synthesis of Curable Fluorine-containing Polymer having α-fluoroacryloyl Group

Into a 200 ml four-necked flask equipped with a reflux condenser, thermometer, stirrer and dropping funnel were poured 80 ml of diethyl ether, 5.0 g of the fluorine-containing allyl ether homopolymer having hydroxyl which was obtained in Preparation Example 5 and 1.0 g of pyridine, followed by cooling to 5° C. or lower.

Then a solution obtained by dissolving 1.0 g of α-fluoroacrylic acid fluoride in 20 ml of diethyl ether was added thereto dropwise over about 30 minutes with stirring in nitrogen gas stream. After completion of the addition, the flask temperature was raised to room temperature and the stirring was further continued for 4.0 hours.

The ether solution after the reaction was put in the dropping funnel, followed by washing with water, 2% hydrochloric acid solution, 5% aqueous solution of NaCl and water.

The ether solution was dried with anhydrous magnesium sulfate and then was filtered for separation. According to $^{19}$F-NMR analysis of this ether solution, the obtained product was a copolymer containing the fluorine-containing allyl ether (the above-mentioned formula (a-3)) having OH group and the fluorine-containing allyl ether having $-OCOCF=CH_2$ in a percent by mole ratio of 85/15.

The ether solution was coated on a NaCl plate and formed into a cast film at room temperature. According to IR analysis of the cast film, an absorption of a carbon-carbon double bond was observed at 1,661 cm$^{-1}$, and an absorption of C=O group was observed at 1,770 cm$^{-1}$.

The obtained ether solution was coated on a glass plate and formed into a cast film at room temperature. A fluorine content of a part of the cast film was measured by the oxygen flask combustion method. The fluorine content was 55% by mass.

Preparation Example7

Synthesis of Copolymer of TFE and perfluoro-1,3-dioxole

Into a 300 ml autoclave made of SUS316 were poured 300 g of HCFC225 and 1.47 g (corresponding to 1.53% by mole based on the total number of moles of the charged monomer) of 4,4'-bis(t-butylcyclohexyl)peroxy dicarbonate, followed by cooling to 0° C., and then the inside of the system was replaced by nitrogen gas three times. Then thereto were added 30 g of perfluoro-2,2-dimethyl-1,3-dioxole (PDD) of the following formula:

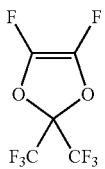

and 11.7 g of tetrafluoroethylene (TFE), followed by stirring at 40° C. for ten hours.

After completion of the reaction, hexane was added to the polymerization solution to precipitate a polymer, followed by separating and drying to obtain 32 g of a white solid.

According to $^{19}$F-NMR analysis, the obtained polymer was one containing TFE and PDD in a percent by mole ratio of 49/51.

Also the glass transition temperature measured by DSC was 110° C.

Further an intrinsic viscosity (η) and an apparent melt viscosity (AMV) were measured by the following methods.

[Intrinsic Viscosity η]

The polymer is dissolved in perfluoro-2-butyltetrahydrofuran, and reduced viscosities are measured at 35° C. with a Ubbelohde capillary viscometer by using sufficiently diluted four or more solutions having different concentrations. An intrinsic viscosity is obtained by extrapolation of the obtained reduced viscosities to the concentration 0.

The intrinsic viscosity (η) was 0.2 (dl/g).

[Apparent Melt Viscosity (AMV)]

AMV is calculated by using the following equation from a melt flow rate (MFR) by the method of ASTM D 2116 by applying a load of 383.1 g at 230° C.

AMV (Pascal·sec)=6.4×Load (g)/MFR (g/10 min)

The apparent melt viscosity (AMV) was not more than 100 (Pascal·sec).

Example 1

Production of Photofunctional Laminated Article (1) Production of Photofunctional Layer (L1)

(Preparation of Photofunctional Composition)

After adding methyl isobutyl ketone (MIBK) to the fluorine-containing polymer (ether solution) of Preparation Example 6 having α-fluoroacryloyl group, ether was distilled off with an evaporator to obtain a MIBK solution having a polymer concentration of 15% by mass.

To 2.0 g of the obtained polymer solution were added and dissolved 3 mg of 2-hydroxy-2-methylpropiophenone as an active energy curing initiator and 9 mg of the europium complex (Eu(CF$_3$COCHCOCF$_3$)$_3$) obtained in Preparation Example 1.

(Production of Photofunctional Layer (L1))

The above photofunctional composition was applied by an applicator on a micro slide glass (transparent substrate (L0)) having a refractive index of 1.521 so that a coating thickness would be about 50 μm, followed by drying at room temperature for ten hours.

Then after the drying, the coating film was irradiated with ultraviolet light at 300 mJ/cm$^2$U by using a high pressure mercury arc lamp.

For determining the thickness of the photofunctional layer (L1) obtained after the light irradiation, a micrometer was used, and the thickness was calculated by subtracting the thickness of the micro slide glass (transparent substrate (L0)) previously measured similarly from the thickness of the whole laminated article. The thickness of the photofunctional layer was 70 μm.

(2) Production of Low Refractive Index Layer (L2)

(Preparation of Composition for Low Refractive Index Layer)

In perfluoro-2-butyltetrahydrofuran was dissolved 2 g of the TFE-PDD copolymer obtained in Preparation Example 7 to prepare a solution having a polymer concentration of 10% by mass.

(Production of Low Refractive Index Layer (L2))

The composition for low refractive index layer was applied by an applicator on the photofunctional layer obtained in (1) above so that a coating thickness would be about 20 μm, followed by drying at room temperature for 12 hours.

The thickness of the low refractive index layer (L2) was obtained by measuring with a micrometer in the same manner as above and calculating by subtracting the thicknesses of the transparent substrate (L0) and the photofunctional layer (L1) from the thickness of the whole photofunctional laminated article. As a result, the thickness of the low refractive index layer (L2) was 30 μtm.

Example 2

Production of Photofunctional Laminated Article (1) Production of Photofunctional Layer (L1)

(Preparation of Photofunctional Composition)

To 50 ml of methyl isobutyl ketone were mixed and dissolved 3 g of the fluorine-containing acrylate polymer obtained in Preparation Example 3 and 0.09 g of the europium complex (Eu(CF$_3$COCHCOCF$_3$)$_3$) obtained in Preparation Example 1.

(Production of Photofunctional Layer (L1)

The above composition was applied by an applicator on a micro slide glass (transparent substrate (L0)) so that a coating thickness would be about 50 μm, followed by drying at room temperature for ten hours to form the photofunctional layer (L1). The thickness of the obtained photofunctional layer (L1) measured in the same manner as in Example 1 was 55 μm.

(2) Production of Low Refractive Index Layer (L2)

The low refractive index layer (L2) of the TFE-PDD copolymer was formed on the photofunctional layer (L1) obtained in (1) above in the same manner as in Example 1.

The thickness of the low refractive index layer (L2) was 35 μm.

Example 3

Production of Photofunctional Laminated Article (1) Production of Photofunctional Layer (L1)

The photofunctional composition was prepared in the same manner as in Example 2 except that the fluorine-containing acrylate polymer obtained in Preparation Example 4 was used instead of the fluorine-containing acrylate polymer obtained in Preparation Example 3, and further the photofunctional layer (L1) was formed on a micro slide glass in the same manner as in Example 2. The thickness of the photofunctional layer (L1) was 45 μm.

(2) Production of Low Refractive Index Layer (L2)

The low refractive index layer (L2) of the TFE-PDD copolymer was formed on the photofunctional layer (L1) obtained in (1) above in the same manner as in Example 1.

The thickness of the low refractive index layer (L2) was 43 μm.

Example 4

Production of Photofunctional Laminated Article (1) Production of Photofunctional Layer (L1)

(Preparation of Photofunctional Composition)

Mixing and dissolution of 1.16 g of fluorine-containing acrylate (8FFA) represented by the formula (a-1):

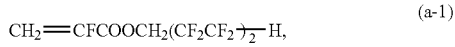

(a-1)

1.83 g of bifunctional fluorine-containing acrylate represented by the formula (a-4):

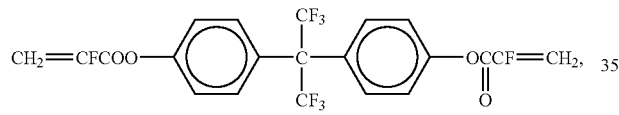

(a-4)

0.09 mg of the europium complex $(Eu(CF_3COCHCOCF_3)_3)$ obtained in Preparation Example 1 and 0.03 g of 2-hydroxy-2-methylpropiophenone were carried out.

(Production of Photofunctional Layer (L1))

The above photofunctional composition was applied by an applicator on a micro slide glass (transparent substrate (L0)) so that a coating thickness would be about 50 μm, immediately followed by irradiation with ultraviolet light at 300 mJ/cm²U by using a high pressure mercury arc lamp to obtain the photofunctional layer (L1) of a uniform transparent coating film having a coating thickness of 60 μm.

(2) Production of Low Refractive Index Layer (L2)

The low refractive index layer (L2) of the TFE-PDD copolymer was formed on the photofunctional layer (L1) obtained in (1) above in the same manner as in Example 1.

The thickness of the low refractive index layer (L2) was 40 μm.

Comparative Example 1

Production of Photofunctional Laminated Article

The photofunctional laminated article having only the photofunctional layer (L1) on a micro slide glass (transparent substrate (L0)) was obtained in the same manner as in Example 1 except that the low refractive index layer (L2) was not provided.

The thickness of the photofunctional layer (L1) was 75 μm.

Comparative Example 2

Production of Photofunctional Laminated Article (1) Production of Photofunctional Layer (L1)

The photofunctional composition was prepared in the same manner as in Example 2 except that 8FF obtained in Preparation Example 3 was used instead of the fluorine-containing acrylate obtained in Preparation Example 2, and further the photofunctional layer (L1) was formed in the same manner as in Example 2. The thickness of the photofunctional layer (L1) was 83 μm.

In this Comparative Example, the low refractive index layer (L2) was not provided on the photofunctional layer (L1).

Comparative Example 3

Production of Photofunctional Laminated Article

The photofunctional composition was prepared in the same manner as in Example 2 by using 8FFA obtained in Preparation Example 3, and further the photofunctional layer (L1) was formed in the same manner as in Example 2. The thickness of the photofunctional layer (L1) was 40 μm.

In this Comparative Example, the low refractive index layer (L2) was not provided on the photofunctional layer (L1).

Comparative Example 4

Production of Photofunctional Laminated Article

The photofunctional composition was prepared in the same manner as in Example 2 except that 2,2,2-trifluoromethyl-αfluoro acrylate (3FFA) obtained in Preparation Example 4 was used instead of the fluorine-containing acrylate obtained in Preparation Example 3, and further the photofunctional layer (L1) was formed in the same manner as in Example 2. The thickness of the photofunctional layer (L1) was 50 μm.

In this Comparative Example, the low refractive index layer (L2) was not provided on the photofunctional layer (L1).

Comparative Example 5

Production of Photofunctional Laminated Article (1) Production of Photofunctional Layer (L1)

The photofunctional composition was prepared in the same manner as in Comparative Example 2, and further the photofunctional layer (L1) was formed in the same manner as in Comparative Example 2. The thickness of the photofunctional layer (L1) was 25 μm.

(2) Production of Low Refractive Index Layer (L2)

The low refractive index layer (L2) of the TFE-PDD copolymer was formed on the photofunctional layer (L1) obtained in (1) above in the same manner as in Example 1.

The thickness of the low refractive index layer (L2) was 49 μm.

Experimental Example 1

Measurement of Physical Properties of each Layer of Photofunctional Laminated Article With respect to the photofunctional laminated articles of Examples 1 to 4 and Comparative Examples 1 to 5, physical properties of each layer were measured by the following methods.

(1) Measurement of Refractive Index of Photofunctional Layer (L1)

The coating films of the photofunctional layer (L1) were formed in the same manner as in each Example and Comparative Example except that the photofunctional compositions prepared in Examples 1 to 4 and Comparative Examples 1 to 5 were applied by an applicator on an aluminum foil so that a coating film thickness would be about 100 μm.

The aluminum foil was melted with diluted hydrochloric acid to obtain a transparent film.

The refractive index ($n_{L1}$) of the film containing the above-mentioned rare earth metal compound was measured at 550 nm wavelength by using an Abbe's refractometer.

(2) Measurement of Refractive Index of Low Refractive Index Layer (L2)

The coating films of the low refractive index layer (L2) was formed in the same manner as in Example 1 except that the composition for the low refractive index layer prepared in Example 1 was applied on an aluminum foil so that a coating film thickness would be about 100 μm.

The aluminum foil was melted with diluted hydrochloric acid to obtain a transparent film.

The refractive index ($n_{L2}$) of the film was measured at 550 nm wavelength by using an Abbe's refractometer.

Further from the results of the above (1) and (2), the difference ($n_{L1} - n_{L2}$) in the refractive index between the photofunctional layer (L1) and the low refractive index layer (L2) was calculated.

The results of each experiment are shown in Table 1.

Experimental Example 2

Measurement of Optical Characteristics of Photofunctional Laminated Article

With respect to the photofunctional laminated articles of Examples 1 to 4 and Comparative Examples 1 to 5, optical characteristics and appearance were measured by the following methods.

(1) Measurement of Transmissivity of Photofunctional Laminated Article

The photofunctional laminated articles of Examples 1 to 4 and Comparative Examples 1 to 5 were set so that the low refractive index layer (L2) was located at the side of the incident light side of the spectrophotometer, and transmissivity at 394 nm and 615 nm was measured.

(2) Relative Intensity of Light Emission

The photofunctional laminated articles of Examples 1 to 4 and Comparative Examples 1 to 5 were set on the fluorescence spectrophotometer and were irradiated with a given amount of light of 394 nm as the excitation light to measure a fluorescence spectrum.

In measuring the fluorescence spectrum, the excitation light was irradiated from the side of the transparent substrate (L0) at an angle of 45° to the horizontal surface of the transparent substrate (L0).

The fluorescence spectrum was measured with a light receiving portion provided at the side of the transparent substrate (L0) at an angle of 90° to the incident light.

In the obtained fluorescence spectrum, attention was directed to the peak area of light emission at 615 nm, and a relative peak area ratio of light emission of each photofunctional laminated article was calculated and determined to be a relative intensity of light emission when the intensity of light emission peak at 615 nm of the photofunctional laminated article of Comparative Example 2 was assumed to be 100.

(3) Appearance of Photofunctional Laminated Article

With respect to the photofunctional laminated articles of Examples 1 to 4 and Comparative Examples 1 to 5, transparency was evaluated with naked eyes by the following criteria.

◯: There is no precipitation of rare earth metal complex in photofunctional film and the article is completely transparent.

X: There is observed precipitation of rare earth metal complex and turbidity.

The results of each experiment are shown in Table 1.

TABLE 1

| | Refractive index $n_{L0}$ of transparent substrate (L0) | Refractive index $n_{L1}$ of photofunctional layer (L1) | Refractive index $n_{L2}$ of low refractive index layer (L2) | Difference in refractive index: ($n_{L1} - n_{L2}$) | Transmissivity of laminated article (%) 394 nm | 615 nm | Relative intensity of light emission at 615 nm | Appearance |
|---|---|---|---|---|---|---|---|---|
| Ex. 1 | 1.521 | 1.380 | 1.324 | 0.056 | 74 | 92 | 300 | ◯ |
| Ex. 2 | | 1.381 | | 0.057 | 85 | 91 | 230 | ◯ |
| Ex. 3 | | 1.391 | | 0.067 | 85 | 88 | 210 | ◯ |
| Ex. 4 | | 1.385 | | 0.061 | 80 | 91 | 270 | ◯ |
| Com. Ex. 1 | | 1.380 | — | — | 76 | 90 | 170 | ◯ |
| Com. Ex. 2 | | 1.490 | — | — | 80 | 84 | 100 | ◯ |
| Com. Ex. 3 | | 1.381 | — | — | 90 | 92 | 195 | ◯ |
| Com. Ex. 4 | | 1.391 | — | — | 84 | 90 | 170 | ◯ |
| Com. Ex. 5 | | 1.490 | 1.324 | 0.166 | 91 | 91 | 120 | ◯ |

INDUSTRIAL APPLICABILITY

According to the photofunctional laminated article of the present invention, various photofunctionalities, particularly an intensity of light emission, light emitting efficiency and further fluorescence life and light amplifying property can be enhanced.

The invention claimed is:

1. A photofunctional laminated article which comprises:
   (L0) a transparent substrate,
   (L1) a photofunctional layer comprising a fluorine-containing polymer (A) and a rare earth metal compound (B) and being formed on the substrate (L0) and
   (L2) a low refractive index layer formed on the layer (L1), and is characterized in that when refractive indices of each layer are assumed to be n(L0), n(L1) and n(L2), the following equation:

$$n(L0) \geq n(L1) > n(L2)$$

is satisfied.

2. The photofunctional laminated article of claim 1, wherein the fluorine-containing polymer (A) in the photofunctional layer (L1) is a non-crystalline polymer having a fluorine content of not less than 30% by mass.

3. The photofunctional laminated article of claim 1, wherein the fluorine-containing polymer (A) in the photofunctional layer (L1) is a fluorine-containing acrylic polymer having a glass transition temperature of not less than 40° C. and a fluorine content of not less than 50% by mass.

4. The photofunctional laminated article of claim 1, wherein the fluorine-containing polymer (A) in the photofunctional layer (L1) is a fluorine-containing acrylic polymer having a glass transition temperature of not less than 100° C. and a fluorine content of not less than 30% by mass and less than 50% by mass.

5. The photofunctional laminated article of claim 1, wherein the fluorine-containing polymer (A) in the photofunctional layer (L1) is a fluorine-containing acrylic polymer comprising:
   a structural unit derived from at least one selected from fluorine-containing acrylates (a1-1) represented by the formula (1):

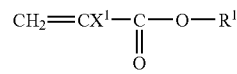

wherein $X^1$ is H, F, Cl, $CH_3$ or $CF_3$; $R^1$ is selected from monovalent hydrocarbon groups which have 1 to 50 carbon atoms and may have ether bond and monovalent fluorine-containing hydrocarbon groups which have 1 to 50 carbon atoms and may have ether bond, provided that at least either $X^1$ or $R^1$ contains fluorine atom, and
   a structural unit derived from at least one selected from polyfunctional acrylates (a1-2) represented by the formula (4):

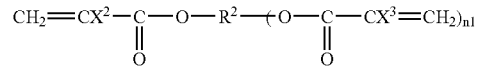

wherein $X^2$ and $X^3$ are the same or different and each is H, F, Cl, $CH_3$ or $CF_3$; n1 is an integer of 1 to 6; $R^2$ is a (n1+1)-valent organic group having 1 to 50 carbon atoms.

6. The photofunctional laminated article of claim 1, wherein the transparent substrate (L0) is made of a glass material.

7. The photofunctional laminated article of claim 1, wherein the transparent substrate (L0) is made of a transparent resin.

8. The photofunctional laminated article of claim 7, wherein the transparent resin is at least one kind selected from acrylic resins, polycarbonate resins, transparent polyetheylene terephthalates, methyl cellulose resins and cycloolefin resins.

9. The photofunctional laminated article of claim 7, wherein the transparent substrate (L0) is in the form of film.

* * * * *